(12) United States Patent
Park et al.

(10) Patent No.: US 12,176,376 B2
(45) Date of Patent: Dec. 24, 2024

(54) IMAGE SENSOR

(71) Applicant: Samsung Electronics Co., Ltd., Suwon-si (KR)

(72) Inventors: Junghoon Park, Hwaseong-si (KR); Hyungjin Bae, Suwon-si (KR); Seungho Shin, Asan-si (KR); Youngsun Oh, Hwaseong-si (KR); Moosup Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 598 days.

(21) Appl. No.: 17/533,468

(22) Filed: Nov. 23, 2021

(65) Prior Publication Data
US 2022/0328557 A1   Oct. 13, 2022

(30) Foreign Application Priority Data

Apr. 9, 2021   (KR) ........................ 10-2021-0046523

(51) Int. Cl.
*H01L 27/146*   (2006.01)

(52) U.S. Cl.
CPC .. *H01L 27/14654* (2013.01); *H01L 27/14607* (2013.01); *H01L 27/14621* (2013.01); *H01L 27/14627* (2013.01); *H01L 27/1463* (2013.01); *H01L 27/1464* (2013.01); *H01L 27/14645* (2013.01); *H01L 27/14689* (2013.01)

(58) Field of Classification Search
CPC ......... H01L 27/14654; H01L 27/14607; H01L 27/14627; H01L 27/1463; H01L 27/1464; H01L 27/14645
See application file for complete search history.

(56) References Cited

U.S. PATENT DOCUMENTS

| | | | |
|---|---|---|---|
| 9,748,299 B2 | 8/2017 | Ahn et al. | |
| 9,818,781 B2 | 11/2017 | Lee et al. | |
| 10,015,426 B2 | 7/2018 | Ishiwata | |
| 10,347,688 B2 | 7/2019 | Kim | |
| 10,763,291 B2 | 9/2020 | Shimotsusa | |
| 10,811,453 B1 | 10/2020 | Mun et al. | |
| 10,818,722 B2 | 10/2020 | Suzuki et al. | |
| 10,872,919 B2 | 12/2020 | Takizawa et al. | |
| 2016/0156862 A1* | 6/2016 | Yoshimura | H04N 25/75 348/308 |
| 2019/0096929 A1* | 3/2019 | Chiang | H01L 27/14612 |

(Continued)

*Primary Examiner* — Mark W Tornow
(74) *Attorney, Agent, or Firm* — Muir Patent Law, PLLC

(57) ABSTRACT

An image sensor includes a substrate including a first surface and a second surface facing the first surface, a first photodiode located in a first region of the substrate and generating photocharges from light incident on the first region, a second photodiode located in a second region of the substrate and generating photocharges from light incident on the second region, and an isolation structure defining the first region in which the first photodiode is located and the second region in which the second photodiode is located, and extending between the first photodiode and the second photodiode. An area of the second region is smaller than an area of the first region, a first end of the isolation structure is coplanar with the second surface, and the isolation structure extends in a vertical direction from the second surface of the substrate toward the first surface of the substrate.

20 Claims, 19 Drawing Sheets

(56) References Cited

U.S. PATENT DOCUMENTS

2019/0288018 A1* 9/2019 Tomekawa ........ H01L 27/14609
2020/0335537 A1 10/2020 Yanagita et al.
2022/0293652 A1* 9/2022 Chen ...................... H04N 25/77

* cited by examiner

IMAGE SENSOR

CROSS-REFERENCE TO RELATED APPLICATION

This application is based on and claims priority under 35 U.S.C. § 119 to Korean Patent Application No. 10-2021-0046523, filed on Apr. 9, 2021, in the Korean Intellectual Property Office, the disclosure of which is incorporated by reference herein in its entirety.

BACKGROUND

The inventive concept relates to an image sensor, and more particularly, to a complementary metal-oxide semiconductor (CMOS) image sensor.

A LED flicker mitigation (LFM) image sensor may have a wide dynamic range (WDR). To achieve WDR, the LFM image sensor may include a plurality of photodiodes having different sensitivity. Photodiodes receive light and generate photocharges. Photocharges generated by one photodiode may move toward an adjacent photodiode having a different sensitivity at a high illuminance. The blooming phenomenon between photodiodes having different sensitivity may distort an image.

SUMMARY

The inventive concept provides an image sensor with reduced blooming for a wider wide dynamic range (WDR) and a higher signal to noise ratio (SNR).

According to an aspect of the inventive concept, there is provided an image sensor including a substrate including a first surface and a second surface facing the first surface, a first photodiode located in a first region of the substrate and generating photocharges from light incident on the first region of the first surface, a second photodiode located in a second region of the substrate and generating photocharges from light incident on the second region of the first surface, and an isolation structure defining the first region in which the first photodiode is located and the second region in which the second photodiode is located, and extending between the first photodiode and the second photodiode. An area of the second region is smaller than an area of the first region, a first end of the isolation structure is coplanar with the second surface, and the isolation structure extends in a vertical direction from the second surface of the substrate toward the first surface of the substrate.

According to an aspect of the inventive concept, there is provided an image sensor including a substrate including a first surface and a second surface facing the first surface, a high-sensitive photodiode disposed in the substrate and having a first sensitivity, a low-sensitive photodiode disposed in the substrate and having a second sensitivity lower than the first sensitivity of the high-sensitive photodiode, and an isolation structure configured to electrically isolate the high-sensitive photodiode and the low-sensitive photodiode from each other. The isolation structure completely penetrates the substrate in a vertical direction from the second surface of the substrate to the first surface of the substrate.

According to an aspect of the inventive concept, there is provided an image sensor including a substrate including a first surface and a second surface facing each other, a first micro-lens on a first region of the first surface, a second micro-lens on a second region of the first surface, a first photodiode located in a portion of the substrate below the first micro-lens; a second photodiode located in a portion of the substrate below the second micro-lens, an isolation structure extending in a vertical direction from the second surface toward the first surface and surrounding each of the first photodiode and the second photodiode, a first transfer gate extending into the substrate from the second surface of the substrate and electrically connected to the first photodiode, and a second transfer gate extending into the substrate from the second surface of the substrate and electrically connected to the second photodiode. An area of the second micro-lens is smaller than an area of the first micro-lens.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
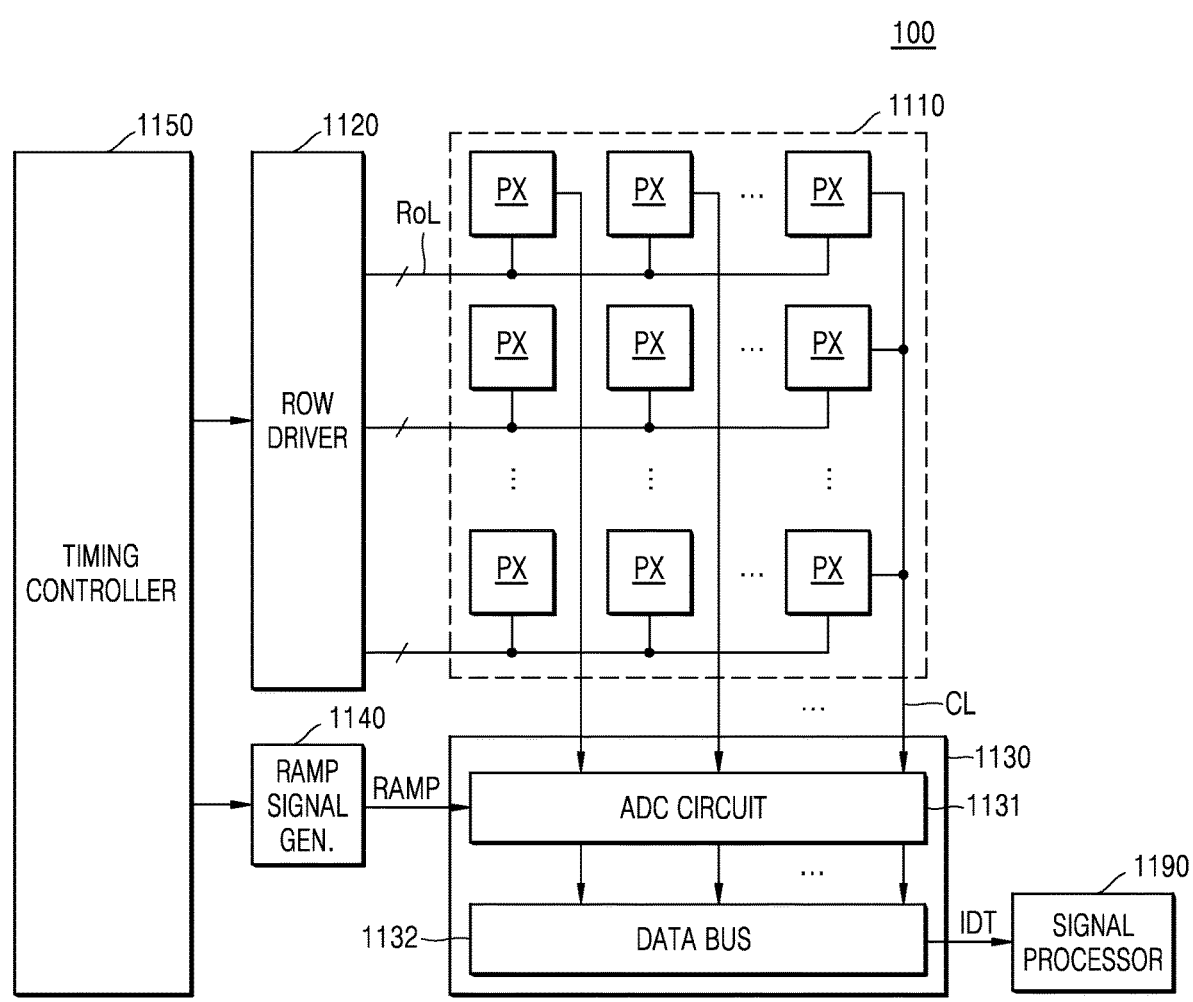
FIG. 1 is a block diagram of an image sensor according to embodiments of the inventive concept.

FIG. 1 is a block diagram of an image sensor 100 according to embodiments of the inventive concept.

The image sensor 100 may be mounted on an electronic device. For example, the image sensor 100 may be installed on an electronic device such as a camera, a smartphone, a wearable device, an Internet of Things (IoT) device, a household appliance, a tablet personal computer (PC), a personal digital assistant (PDA), a portable multimedia player (PMP), a navigation device, a drone, and an advanced drivers assistance system (ADAS).

Referring to FIG. 1, the image sensor 100 may include a pixel array 1110, a row driver 1120, a read-out circuit 1130, a ramp signal generator 1140, a timing controller 1150, and a signal processor 1190. The read-out circuit 1130 may include an analog-digital conversion (ADC) circuit 1131 and a data bus 1132.

The pixel array 1110 may include a plurality of pixels PX arranged in rows and columns. Each pixel PX may convert light into an electric signal. The pixel array 1110 may be connected to a plurality of row lines RoL and a plurality of column lines CL.

The row driver 1120 drives the pixel array 1110 row-by-row. The row driver 1120 may decode a row control signal (e.g., an address signal) received from the timing controller 1150 and select at least one of the row lines RoL in response to a decoded row control signal. For example, the row driver 1120 may generate a selection signal for selecting at least one of the row lines RoL. The pixel array 1110 outputs a pixel signal, e.g., a pixel voltage, from a row of the pixels PX selected by the selection signal provided from the row driver 1120.

The ramp signal generator 1140 may generate a ramp signal RAMP that increases or decreases at a predetermined slope. In some embodiments, a voltage level of the ram signal RAMP may increase or decrease at a predetermined slope. The ramp signal generator 1140 may provide the ramp signal RAMP to the ADC circuit 1131 of the read-out circuit 1130.

The read-out circuit 1130 may read out a pixel signal from the pixels PX of the row selected by the row driver 1120 from among the pixels PX. The pixel signal may include a reset signal or an image signal (or a sensing signal). The read-out circuit 1130 may convert reset signals and image signals received from the pixel array 1110 through the column lines CL into digital data based on the ramp signal RAMP from the ramp signal generator 1140, thereby generating and outputting pixel values corresponding to the pixels PX row-by-row.

The ADC circuit 1131 may convert a pixel signal (e.g., a pixel voltage) received from the pixel array 1110 into a pixel value, which is a digital signal. The ADC circuit 1131 may include a plurality of ADCs respectively corresponding to the column lines CL, and the ADCs may compare reset signals and image signals received from respectively corresponding column lines CL with the ramp signal RAMP and generate pixel values based on results of such comparison. For example, an ADC may remove a reset signal from an image signal and generate a pixel value indicating an amount of light detected by the pixel PX.

The ADC circuit 1131 may include a plurality of correlated double sampling (CDS) circuits and a plurality of counter circuits. A CDS circuit may compare a pixel signal received through the column line CL with the ramp signal RAMP and output a result of the comparison. A CDS circuit may sample and hold a pixel signal provided by the pixel PX according to a CDS scheme, double-sample a level of particular noise (e.g., a reset signal) and a level according to an image signal, and generate a comparison signal based on a level corresponding to a difference between the level of the particular noise and the level of the image signal. In some embodiments, the CDS circuit may include one or more comparators. A comparator may be implemented as an optional transconductance amplifier (OTA) (or a differential amplifier). The ADC circuit 1131 may include a plurality of delta reset sampling (DRS) circuits. A DRS circuit may sample a pixel signal by reading out an image signal and then reading out a reset signal according to a DRS scheme.

A plurality of pixel values generated by the ADC circuit 1131 may be output as image data IDT through the data bus 1132. The data bus 1132 may temporarily store and then output pixel values output from the ADC circuit 1131. The data bus 1132 may include a plurality of column memories (e.g., a plurality of buffer memories) and a column decoder. For example, each pixel in a column may be coupled to a corresponding column memory. A plurality of pixel values stored in the column memories may be output as the image data IDT under the control of the column decoder. For example, the image data IDT may be provided to the signal processor 1190 inside or outside the image sensor 100.

In some embodiments, the image sensor 100 may further include a bias current controller (not shown) for increasing or decreasing a bias current when an operation mode of the pixel PX is changed during a read-out period. A plurality of bias current controllers may be connected to the column lines CL, respectively.

The signal processor 1190 may perform various operation such as noise reducing processing, gain adjustment, waveform formulation, interpolation processing, white balance processing, gamma processing, and edge emphasis processing on the image data IDT. In some embodiments, the pixel array 1110 may operate in a plurality of modes during one frame period, and the signal processor 1190 may receive a plurality of pieces of image data IDT, from the data bus 1132, corresponding to the modes, respectively, and merge the pieces of image data IDT, thereby generating an image having a high dynamic range. In some embodiments, the signal processor 1190 may be provided in a processor outside the image sensor 100.

Figure 2:
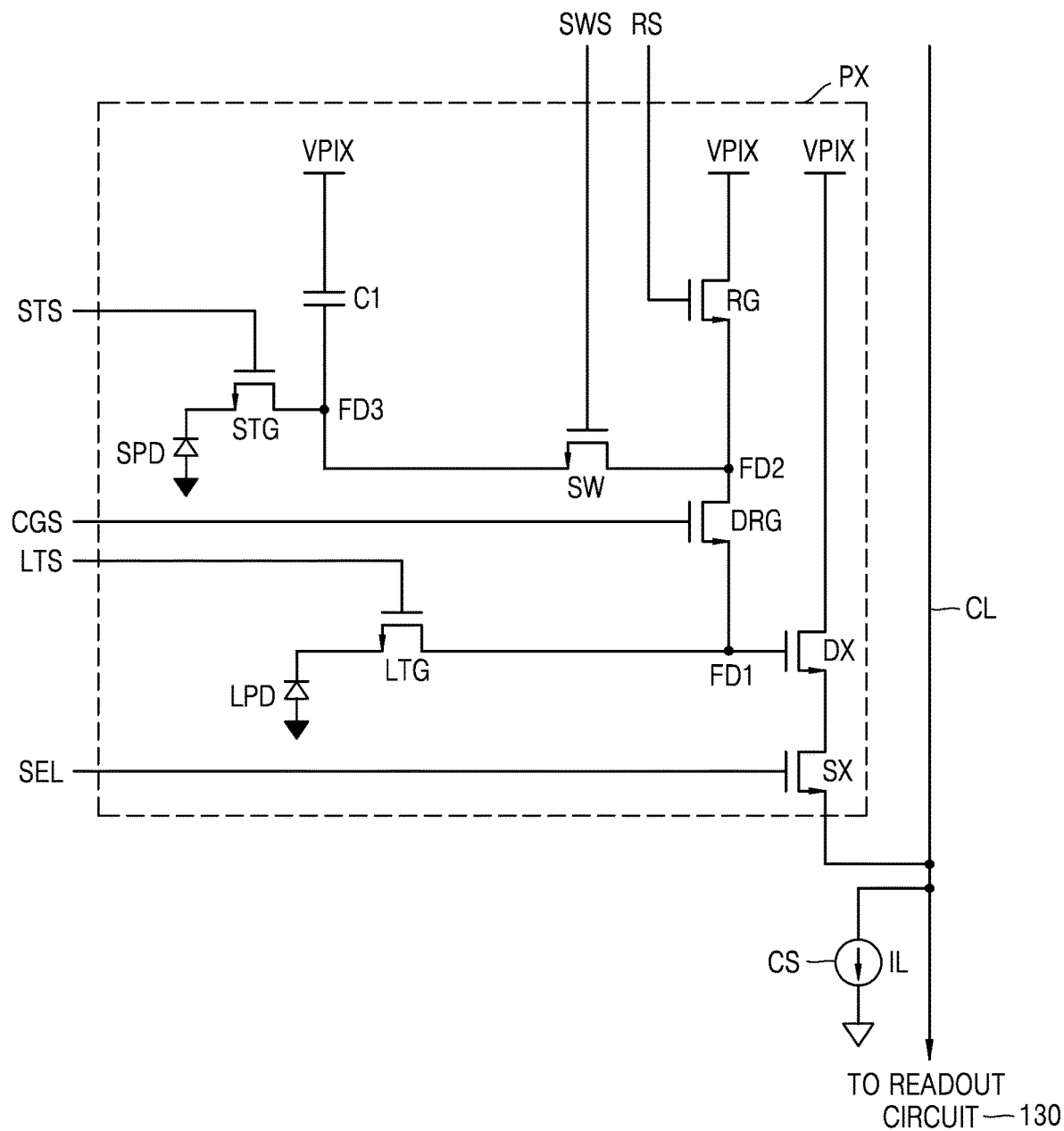
FIG. 2 is a circuit diagram of a pixel included in an image sensor according to embodiments of the inventive concept.

FIG. 2 is a circuit diagram of the pixel PX included in an image sensor according to embodiments of the inventive concept.

The pixel PX may include a plurality of photodiodes, e.g., a first photodiode LPD and a second photodiode SPD. The pixel PX may further include a first transfer gate LTG, a second transfer gate STG, a reset transistor RG, a driving transistor DX, a selecting transistor SX, a gain control transistor DRG, and a switch transistor SW. The pixel PX may further include a plurality of floating diffusion regions, e.g., first to third floating diffusion regions FD1, FD2, and FD3. The pixel PX may further include a capacitor C1.

The first photodiode LPD and the second photodiode SPD may generate photocharges in response to incident light. For example, the photocharges may include electrons and holes. The first photodiode LPD and the second photodiode SPD may have different sensitivity. For example, the sensitivity of the first photodiode LPD may be higher than the sensitivity of the second photodiode SPD. As described above, a structure in which one pixel PX includes the first photodiode LPD and the second photodiode SPD having different sensitivity may be referred to as a split photodiode structure.

A first source/drain of the first transfer gate LTG may be connected to the first photodiode LPD, whereas a second source/drain of the first transfer gate LTG may be connected to a first floating diffusion region FD1. The first transfer gate LTG may transfer photocharges generated by the first photodiode LPD to the first floating diffusion region FD1 in response to a first transfer control signal LTS.

A first source/drain of the gain control transistor DRG may be connected to the first floating diffusion region FD1, whereas a second source/drain of the gain control transistor DRG may be connected to the second floating diffusion region FD2. The gain control transistor DRG may be turned on or off by a conversion gain signal CGS. When the gain control transistor DRG is turned on, the first floating diffusion region FD1 and the second floating diffusion region FD2 are connected with each other. The first floating diffusion region FD1 and the second floating diffusion region FD2 are connected with each other to form a connected floating diffusion region, and each of the first photodiode LPD and the second photodiode SPD may transfer photocharges to the connected floating diffusion region. The connected floating diffusion region may have increased capacitance compared to if the first floating diffusion region FD1 and the second floating diffusion region FD2 are not connected with each other. When the capacitance increases, a conversion gain of each of the first photodiode LPD and the second photodiode SPD may decrease. On the contrary, when the gain control transistor DRG is turned off, the first floating diffusion region FD1 and the second floating diffusion region FD2 are separated from each other and the capacitance of each of the first floating diffusion region FD1 and the second floating diffusion region FD2 decreases compared to if the first floating diffusion region FD1 and the second floating diffusion region FD2 are connected with each other, and thus, the conversion gain of each of the first photodiode LPD and the second photodiode SPD may increase compared to if the first floating diffusion region FD1 and the second floating diffusion region FD2 are connected with each other. Here, the conversion gain refers to a rate at which charges accumulated in a floating diffusion region are converted to a voltage. When the capacitance increases, the conversion gain decreases.

A first source/drain of the second transfer gate STG may be connected to the second photodiode SPD, and a second source/drain of the second transfer gate STG may be connected to the third floating diffusion region FD3. The second transfer gate STG may transfer photocharges generated by the second photodiode SPD to the third floating diffusion region FD3 in response to a second transfer control signal STS.

A first electrode of the capacitor C1 may be connected to the third floating diffusion region FD3, whereas a second electrode of the capacitor C1 may be connected to a pixel voltage VPIX. In an embodiment, a voltage other than the pixel voltage VPIX may be applied to the second electrode of the capacitor C1. Photocharges generated by the second photodiode SPD and overflowed from the second photodiode SPD may be accumulated in the capacitor C1.

A first source/drain of the switch transistor SW may be connected to the second floating diffusion region FD2, whereas a second source/drain of the switch transistor SW may be connected to the third floating diffusion region FD3. The switch transistor SW may connect the second floating diffusion region FD2 and the third floating diffusion region FD3 with each other in response to a switch control signal SWS.

A reset voltage (e.g., the pixel voltage VPIX) may be applied to a first source/drain of the reset transistor RG, whereas a second source/drain of the reset transistor RG may be connected to the second floating diffusion region FD2. The reset transistor RG may reset photocharges accumulated in at least one of the first to third floating diffusion regions FD1, FD2, and FD3 in response to a reset control signal RS. In an embodiment, the reset voltage may not be the same as the pixel voltage VPIX.

A first source/drain of the driving transistor DX may be connected to the selecting transistor SX, whereas a driving voltage (e.g., the pixel voltage VPIX) may be applied to a second source/drain of the driving transistor DX. The driving transistor DX may operate as a source follower based on a bias current IL generated by a current source CS connected to the column line CL. The driving transistor DX may output a voltage corresponding to an amount of charges accumulated in at least one of the first to third floating diffusion regions FD1 to FD3.

A first source/drain of the selecting transistor SX may be connected to the driving transistor DX, whereas a second source/drain of the selecting transistor SX may be connected to the column line CL. The selecting transistor SX may output a pixel signal including a reset signal or an image signal to the column line CL in response to a selecting signal SEL.

According to embodiments of the inventive concept, photocharges generated by the first photodiode LPD may be read out in a high conversion gain (HCG) mode or a low conversion gain (LCG) mode according to the conversion gain signal CGS. For example, in the HCG mode, the conversion gain signal CGS may have an inactive level, and the gain control transistor DRG may be turned off. Therefore, the first floating diffusion region FD1 and the second floating diffusion region FD2 may not be connected with each other. In the LCG mode, the conversion gain signal CGS may have an active level, and the gain control transistor DRG may be turned on. Therefore, the first floating diffusion region FD1 and the second floating diffusion region FD2 may be connected with each other and capacitance may increase, and thus, the conversion gain may decrease.

Photocharges generated by the second photodiode SPD may be read out in a first mode for reading out photocharges accumulated in the second photodiode SPD or a second mode for reading out photocharges overflowed from the second photodiode SPD and stored in the capacitor C1.

The first photodiode LPD may generate a first pixel signal corresponding to a first illuminance section corresponding to the lowest illuminance in the HCG mode and generate a second pixel signal corresponding to a second illuminance section corresponding to illuminance higher than that of the first illuminance section in the LCG mode. The second photodiode SPD may generate a third pixel signal corresponding to a third illuminance section corresponding to illuminance higher than that of the second illuminance section in the first mode and generate a fourth pixel signal corresponding to a fourth illuminance section corresponding to the highest illuminance in the second mode. First to fourth pixel signals may be merged into one image, and a merged image may have a high dynamic range. Furthermore, when the exposure time of the second photodiode SPD is increased, LED flicker mitigation (LFM) may be achieved.

Figure 3:
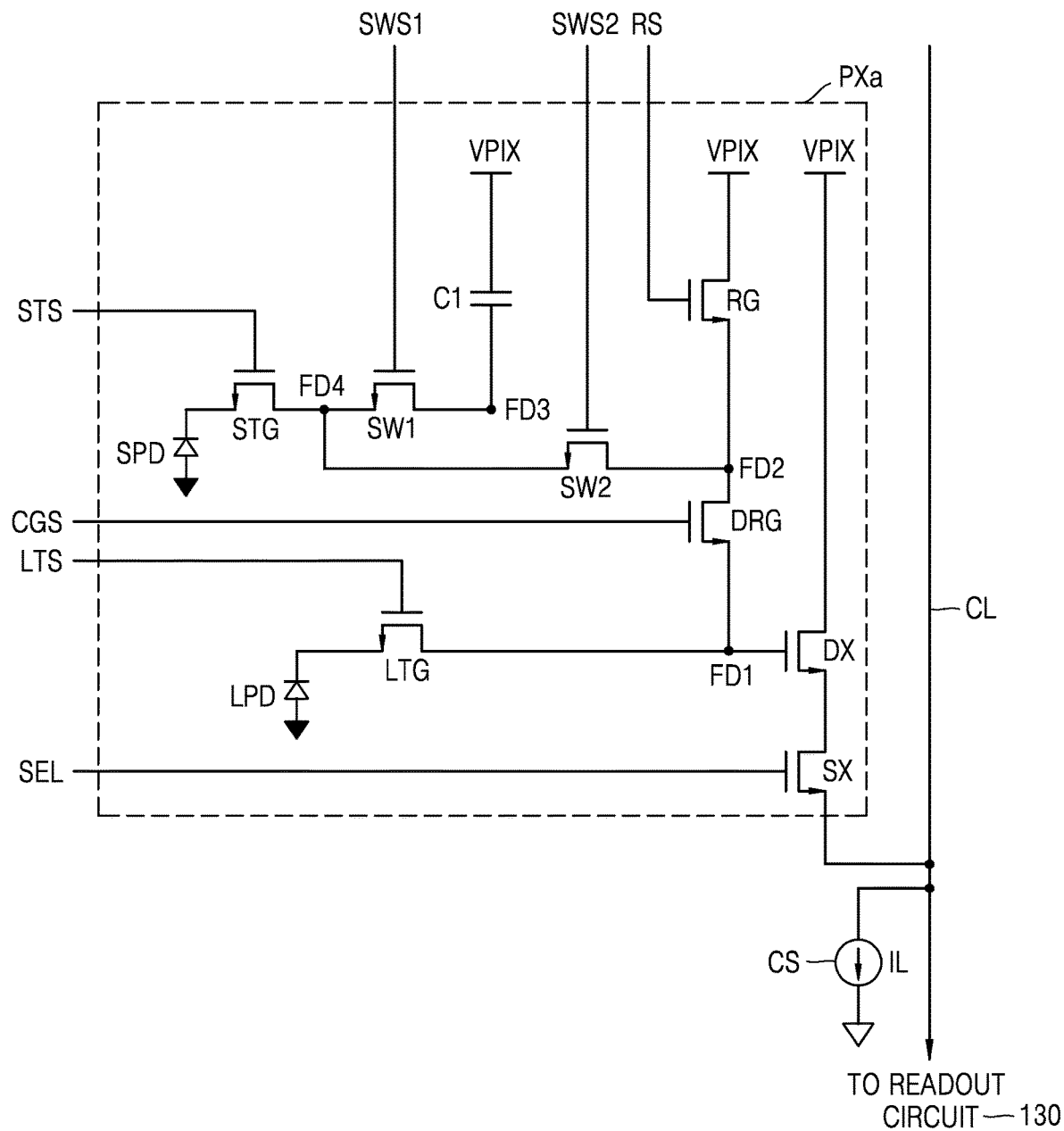
FIG. 3 is a circuit diagram of a pixel included in an image sensor according to embodiments of the inventive concept.

FIG. 3 is a circuit diagram of a pixel PXa included in an image sensor according to embodiments of the inventive concept. Hereinafter, differences between the pixel PX shown in FIG. 2 and the pixel PXa shown in FIG. 3 will be described.

The pixel PXa may include a first switch transistor SW1 and a second switch transistor SW2, instead of the switch transistor SW shown in FIG. 3. The pixel PXa may further include a fourth floating diffusion region FD4.

A first source/drain of the second transfer gate STG may be connected to the second photodiode SPD, and a second source/drain of the second transfer gate STG may be connected to the fourth floating diffusion region FD4. The second transfer gate STG may transfer photocharges generated by the second photodiode SPD to the fourth floating diffusion region FD4 in response to a second transfer control signal STS.

A first source/drain of the first switch transistor SW1 may be connected to the third floating diffusion region FD3, whereas a second source/drain of the first switch transistor SW1 may be connected to the fourth floating diffusion region FD4. The first switch transistor SW1 may connect the third floating diffusion region FD3 and the fourth floating diffusion region FD4 with each other in response to a first switch control signal SWS1. When the third floating diffusion region FD3 and the fourth floating diffusion region FD4 are connected with each other, the capacitance may increase, and the conversion gain may decrease.

A first source/drain of the second switch transistor SW2 may be connected to the fourth floating diffusion region FD4, whereas a second source/drain of the second switch transistor SW2 may be connected to the second floating diffusion region FD2. The second switch transistor SW2 may connect the second floating diffusion region FD2 and the fourth floating diffusion region FD4 to each other in response to a second switch control signal SWS2.

According to embodiments of the inventive concept, when photocharges generated by the second photodiode SPD are read out in the first mode, the first switch control signal SWS1 may have an inactive level, and the first switch transistor SW1 may be turned off. Therefore, the third floating diffusion region FD3 and the fourth floating diffusion region FD4 may not be connected with each other, and the conversion gain may be relatively high in the first mode. When photocharges generated by the second photodiode SPD are read out in the second mode, the first switch control signal SW may have an active level, and the first switch transistor SW1 may be turned on. Therefore, as the third floating diffusion region FD3 and the fourth floating diffusion region FD4 may be connected with each other, the capacitance may increase, and the conversion gain may be relatively low in the second mode.

A dynamic range may be further widened by using the capacitor C1 having high capacitance in the second mode. In the embodiment shown in FIG. 2, the capacitor C1 having high capacitance may reduce the conversion gain, thereby reducing a signal to noise ratio (SNR). However, in the embodiment shown in FIG. 3, by separating the capacitor C1 having high capacitance from the fourth floating diffusion region FD4 by using the first switch transistor SW1, reduction in conversion gain due to the capacitor C1 having high capacitance may be prevented. Therefore, due to a high conversion gain in the first mode, the SNR may increase.

Figure 4:
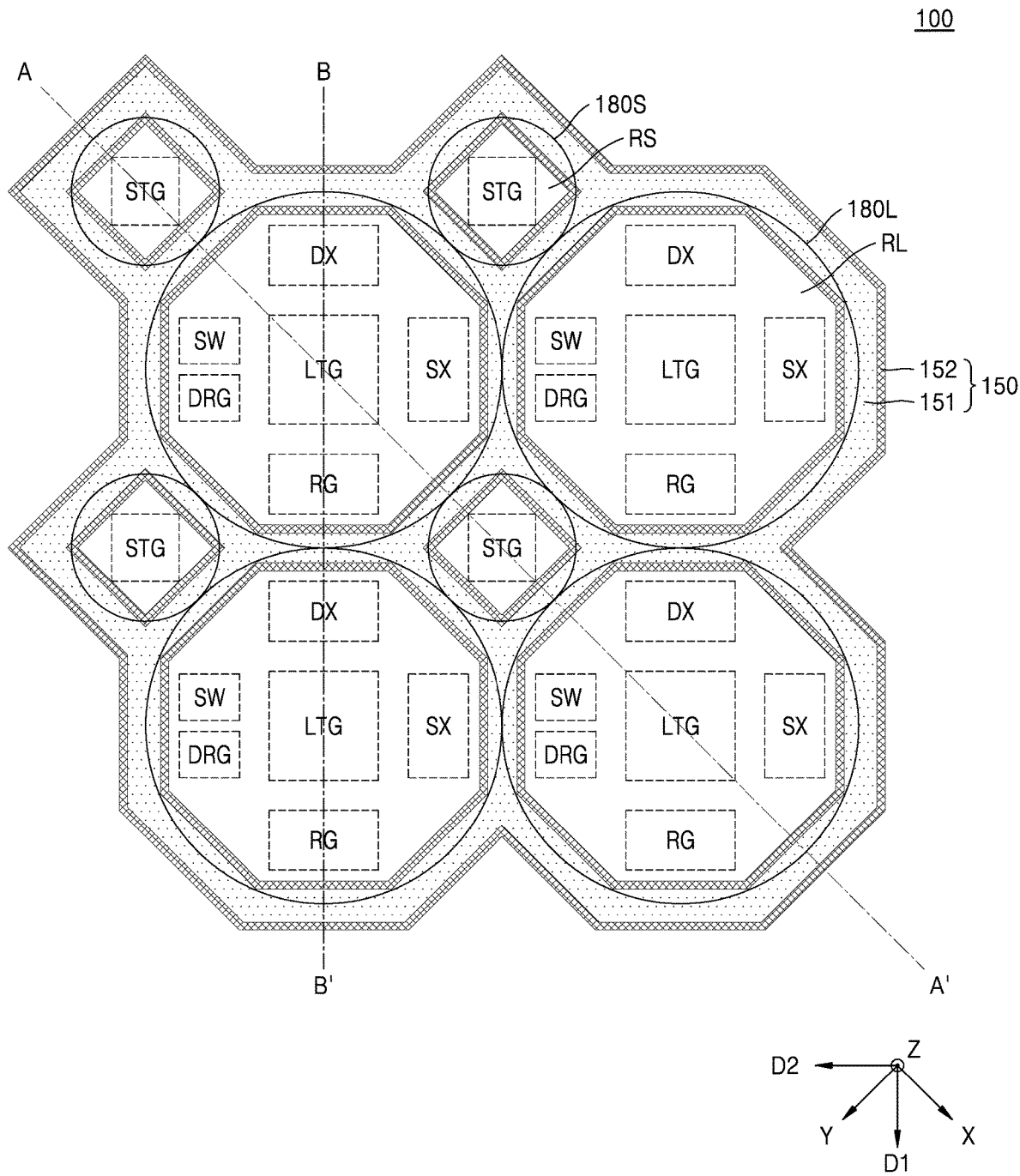
FIG. 4 is a plan view of an image sensor according to embodiments of the inventive concept.
Figure 5:
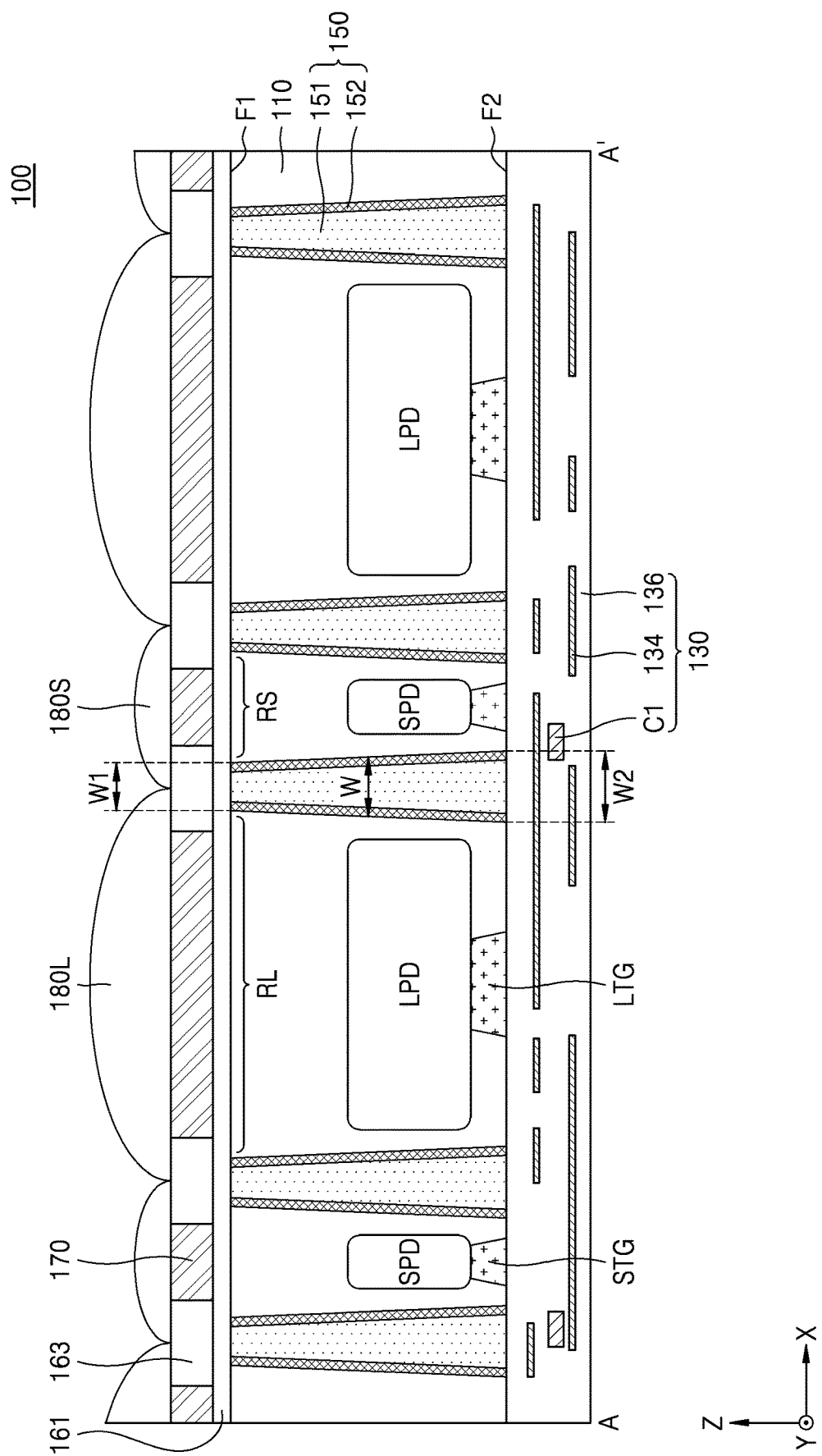
FIG. 5 is a cross-sectional view of an image sensor according to embodiments of the inventive concept, taken along a line A-A' of FIG. 4.
Figure 6:
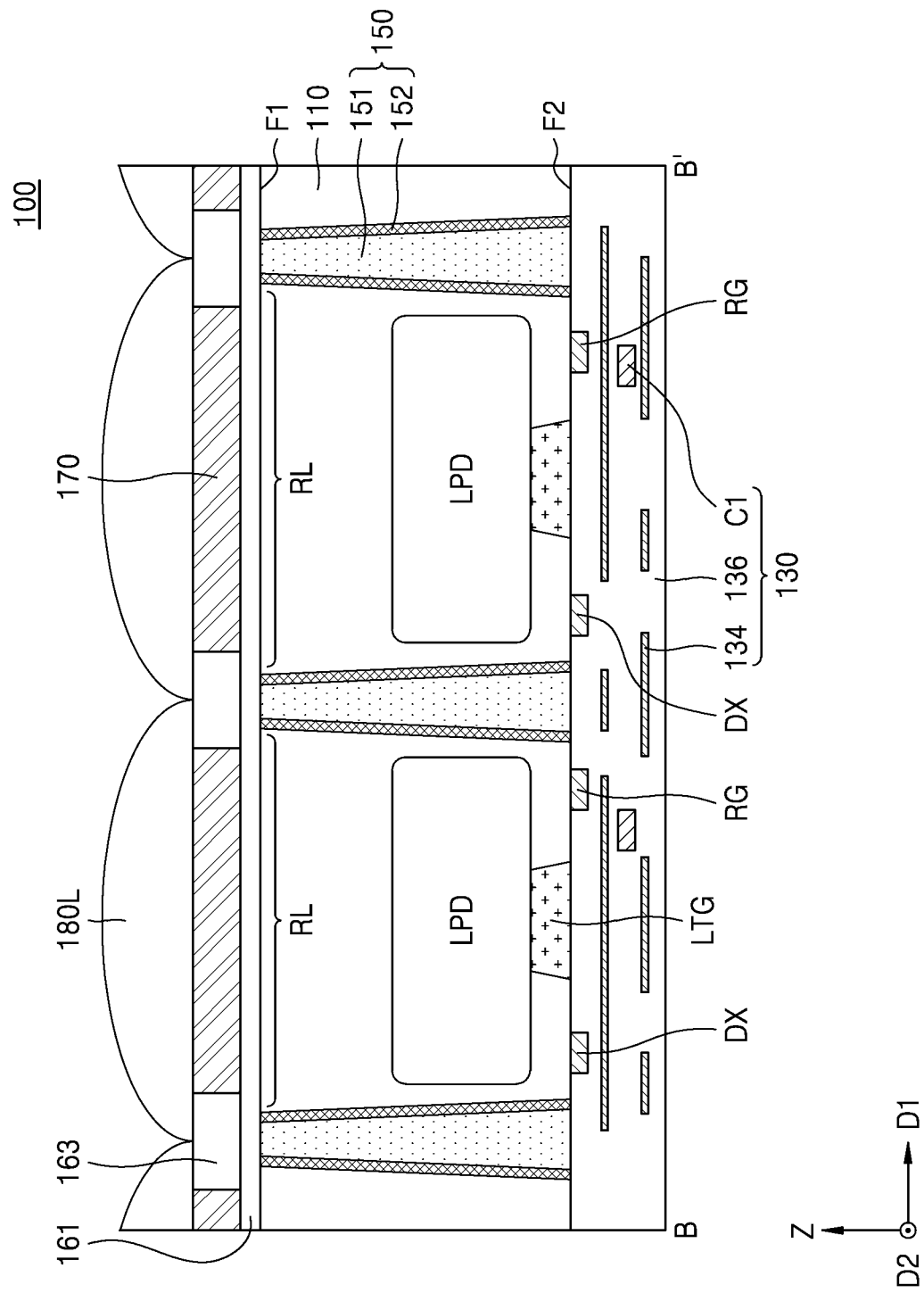
FIG. 6 is a cross-sectional view of an image sensor according to embodiments of the inventive concept, taken along a line B-B' of FIG. 4.

FIG. 4 is a plan view of the image sensor 100 according to embodiments of the inventive concept. FIG. 5 is a cross-sectional view of the image sensor 100 according to embodiments of the inventive concept, taken along line A-A' of FIG. 4. FIG. 6 is a cross-sectional view of the image sensor 100 according to embodiments of the inventive concept, taken along line B-B' of FIG. 4.

Referring to FIGS. 4 to 6, the image sensor 100 may include a substrate 110 having a first surface F1 and a second surface F2, the first photodiode LPD and the second photodiode SPD inside the substrate 110, and an isolation structure 150 extending between the first photodiode LPD and the second photodiode SPD. In some embodiments, the image sensor 100 may further include the first transfer gate LTG and the second transfer gate STG. In some embodiments, the image sensor 100 may further include the reset transistor RG, the selecting transistor SX, the driving transistor DX, the switch transistor SW, and the gain control transistor DRG that are at the second surface F2 of the substrate 110. In some embodiments, the image sensor 100 may further include the first to third floating diffusion regions FD1 to FD3 (refer to FIG. 2) inside the substrate 110. In some embodiment, the image sensor 100 may further include a front surface structure 130 on the second surface F2 of the substrate 110. In some embodiments, the image sensor 100 may further include an anti-reflection layer 161 on the first surface F1 of the substrate 110, a fence 163 and a color filter 170 on the anti-reflection layer 161, and a first micro-lens 180L and a second micro-lens 180S on the fence 163 and the color filter 170.

The substrate 110 may include the first surface F1 and the second surface F2 facing each other. The first surface F1 may be a surface through which light transmitted through the first micro-lens 180L or the second micro-lens 180S enters the substrate 110. The substrate 110 may include or may be formed of a semiconductor material such as a group IV semiconductor material, a group III-V semiconductor material, and a group II-VI semiconductor material. The group IV semiconductor material may include, for example, silicon (Si), germanium (Ge), or silicon-germanium (SiGe). The group III-V semiconductor material may include, for example, gallium arsenide (GaAs), indium phosphorus (InP), gallium phosphorus (GaP), indium arsenic (InAs), indium antimony (InSb), or indium gallium arsenide (InGaAs). The group II-VI semiconductor material may include, for example, zinc telluride (ZnTe) or cadmium sulfide (CdS).

The first photodiode LPD is located inside the substrate 110 and may be configured to generate photocharges from light incident on a first region RL of the first surface F1 of the substrate 110. The first photodiode LPD may be located inside a portion of the substrate 110 below the first region RL. The second photodiode SPD is located inside the substrate 110 and may be configured to generate photocharges from light incident on a second region RS of the first surface F1 of the substrate 110. The second photodiode SPD may be located inside a portion of the substrate 110 below the second region RS.

An area of the second region RS may be smaller than an area of the first region RL. Therefore, for incident light of the same intensity, the second photodiode SPD may generate less photocharges than the first photodiode LPD. In other words, the second photodiode SPD may have sensitivity lower than that of the first photodiode LPD. Therefore, the first photodiode LPD may have a relatively high sensitivity and generate a pixel signal corresponding to a relatively low illuminance, whereas the second photodiode SPD may have a relatively low sensitivity and generate a pixel signal corresponding to a relatively high illuminance.

In some embodiments, as shown in FIG. 4, when viewed from above (i.e., when the image sensor 100 is viewed in a plan view), the first region RL may have an octagonal shape, whereas the second region RS may have a quadrangle shape. However, the shapes of the first region RL and the second region RS are not limited thereto. For example, the shapes of the first region RL and the second region RS may each be circular or quadrangle.

The isolation structure 150 may extend from the second surface F2 of the substrate 110 to the first surface F1 of the substrate 110 in a vertical direction (Z direction) by completely penetrating through the substrate 110 and extend between the first photodiode LPD and the second photodiode SPD. When viewed from above, the isolation structure 150 may surround the first photodiode LPD and the second photodiode SPD. For example, when viewed from above, the isolation structure 150 may surround or may define each of the first photodiode LPD and the second photodiode SPD. Therefore, the isolation structure 150 may isolate the first photodiode LPD and the second photodiode SPD from each other. Therefore, a blooming phenomenon that photocharges generated by one of the first photodiode LPD and the second photodiode SPD move to the other of the first photodiode LPD and the second photodiode SPD may be prevented.

As shown in FIGS. 4 and 6, the isolation structure 150 may further extend between two first photodiodes LPD adjacent to each other. The isolation structure 150 may surround the two first photodiodes LPD adjacent to each other. For example, the isolation structure 150 may surround or may define each of the two first photodiodes LPD adjacent to each other. The two first photodiodes LPD adjacent to each other may be located in respective portions of the substrate 110 below two first regions RL of the first surface F1 of the substrate 110 adjacent to each other. The two first photodiodes LPD adjacent to each other may be configured to generate photocharges from light beams incident on the two first regions RL adjacent to each other, respectively. The two first regions RL adjacent to each other may have the same area as each other.

A portion of the isolation structure 150 between the two first photodiodes LPD adjacent to each other may completely penetrate the substrate 110 from the second surface F2 of the substrate 110 to the first surface F1 of the substrate 110. Therefore, the isolation structure 150 may separate the two first photodiodes LPD adjacent to each other from each other. Therefore, a blooming phenomenon that photocharges generated by any first photodiode LPD move to an adjacent first photodiode LPD may be prevented.

A first end of the isolation structure 150 may be coplanar with the second surface F2 of the substrate 110, whereas a second end of the isolation structure 150 may be coplanar with the first surface F1 of the substrate 110. A width W2 of the first end of the isolation structure 150 in a first horizontal direction (X direction) may be greater than a width W1 of the second end of the isolation structure 150 in the first horizontal direction (X direction). A width W of the isolation structure 150 in the first horizontal direction (X direction) may decrease in a vertical direction (i.e., a Z direction) from the second surface F2 of the substrate 110 toward the first surface F1 of the substrate 110. In some embodiments, a width W of the isolation structure 150 in the first horizontal direction (X direction) may gradually decrease in the vertical direction.

The isolation structure 150 may include a conductive layer 151 and an isolating insulation layer 152. The conductive layer 151 may completely penetrate the substrate 110 by extending from the second surface F2 of the substrate 110 to the first surface F1 of the substrate 110. The isolating insulation layer 152 may extend between the conductive layer 151 and the substrate 110 to electrically isolate the conductive layer 151 from the substrate 110. The conductive layer 151 may include or may be formed of a conductive material such as polysilicon and metal. The isolating insulation layer 152 may include or may be formed of silicon oxide, silicon nitride, a metal oxide, or a combination thereof.

The first transfer gate LTG may extend into the substrate 110 from the second surface F2 of the substrate 110 and may be electrically connected to the first photodiode LPD. As shown in FIG. 4, when viewed from above, the first transfer gate LTG may overlap the center of the first region RL of the first surface F1 of the substrate 110.

The second transfer gate STG may extend into the substrate 110 from the second surface F2 of the substrate 110 and may be electrically connected to the second photodiode SPD. As shown in FIG. 4, when viewed from above, the second transfer gate STG may overlap the center of the second region RS of the first surface F1 of the substrate 110.

The reset transistor RG, the selecting transistor SX, the driving transistor DX, the switch transistor SW, and the gain control transistor DRG may be arranged at the second surface F2 of the substrate 110. Also, the first to third floating diffusion regions FD1 to FD3 (refer to FIG. 2) may be arranged inside the substrate 110.

The front surface structure 130 may be provided on the second surface F2 of the substrate 110. The front surface structure 130 may include a wire 134, the capacitor C1, and an insulation layer 136 surrounding the wire 134 and the capacitor C1. The wire 134 may include or may be formed of tungsten, aluminum, copper, tungsten silicide, titanium silicide, tungsten nitride, titanium nitride, or doped polysilicon. The capacitor C1 may store photocharges generated by the second photodiode SPD and overflowed. The insulation layer 136 may include or may be formed of an insulation material such as silicon oxide, silicon nitride, silicon oxynitride, or a low-k material.

The low-k material may include or may be formed of, for example, at least one of flowable oxide (FOX), torene silazene (TOSZ), undoped silica glass (USG), borosilica glass (BSG), phosphosilica glass (PSG), boro phosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bisbenzocyclobutenes (BCB), SiLK, polyimide, porous polymeric material, and combinations thereof, but is not limited thereto.

The anti-reflection layer 161 may be provided on the first surface F1 of the substrate 110. The anti-reflection layer 161 may include or may be formed of hafnium oxide ($HfO_2$), silicon oxide ($SiO_2$), silicon nitride (SiN), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$) dysprosium ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), or a combination thereof.

The fence 163 may be disposed on the anti-reflection layer 161. The fence 163 may overlap the isolation structure 150 when viewed from above. The fence 163 may include or may be formed of metal or a low refractive index material. For example, the low refractive index material may include polymethylmethacrylate (PMMA), silicon acrylate, cellulose acetate butyrate (CAB), silica, fluoro-silicon acrylate (FSA), or a polymer material in which silica particles are dispersed. The fence 163 may surround a plurality of color filters 170. For example, the fence 163 may surround each of the plurality of color filters 170.

The color filters 170 may be arranged on the anti-reflection layer 161 and may be isolated from one another by the fence 163. The color filters 170 may include a green filter, a blue filter, and a red filter, for example. In some embodiments, the color filters 170 may include a cyan filter, a magenta filter, and a yellow filter, for example.

The first micro-lens 180L and the second micro-lens 180S may be arranged on the color filters 170 and the fence 163. As shown in FIG. 4, when viewed from above, the first micro-lens 180L may overlap the first region RL of the first surface F1 of the substrate 110, whereas the second micro-lens 180S may overlap the second region RS of the first surface F1 of the substrate 110. The first micro-lens 180L may condense incident light, and light condensed by the first micro-lens 180L may be incident on the first photodiode LPD via the color filter 170 and the first region RL. The second micro-lens 180S may condense incident light, and light condensed by the second micro-lens 180S may be incident on the second photodiode SPD via the color filter 170 and the second region RS. The first micro-lens 180L and the second micro-lens 180S may include or may be formed of, for example, a resin-based material such as a styrene-based resin, an acrylic resin, a styrene-acrylic copolymer-based resin, and a siloxane-based resin.

Figure 7:
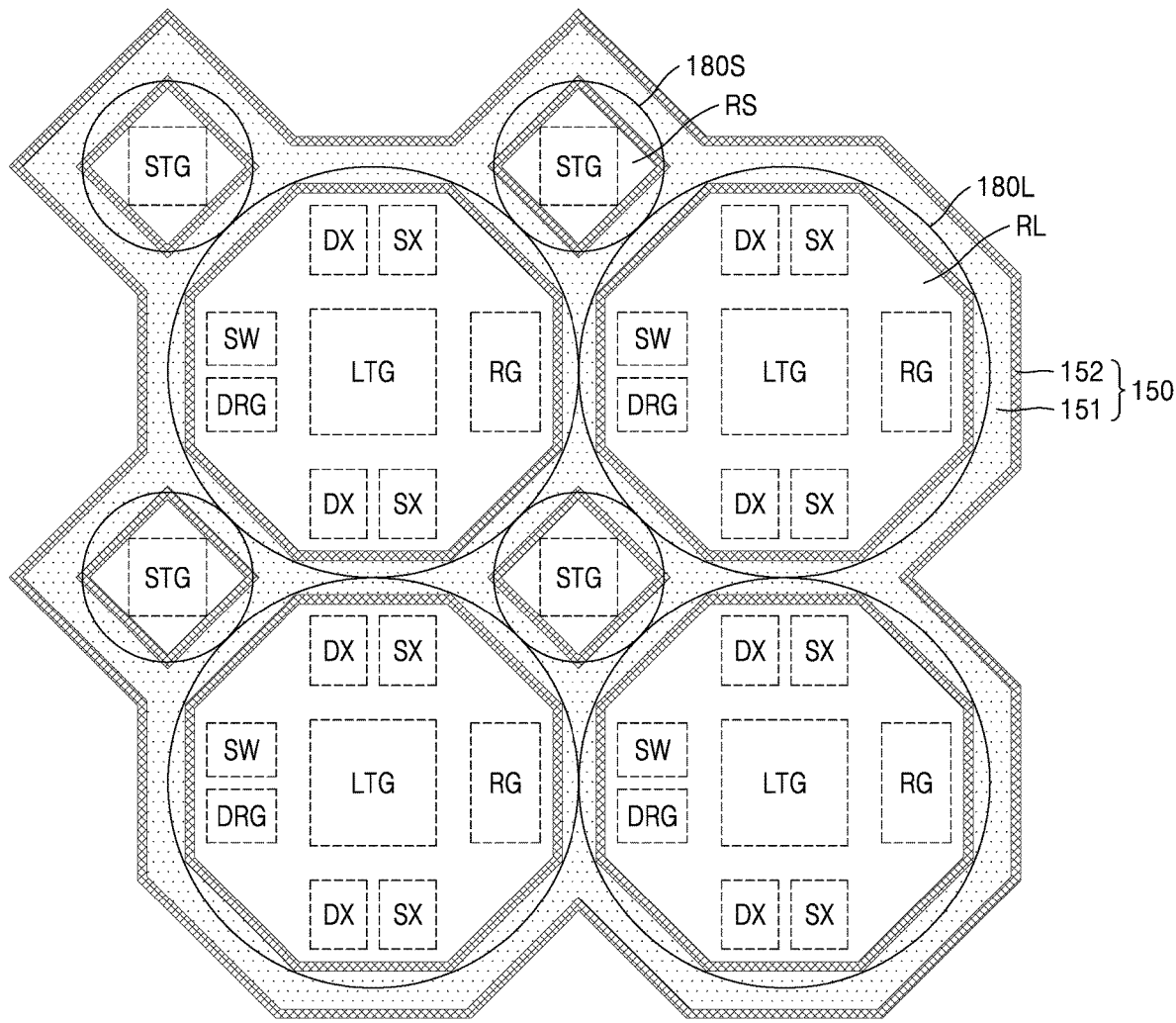
FIG. 7 is a plan view of an image sensor according to embodiments of the inventive concept.
Figure 8:
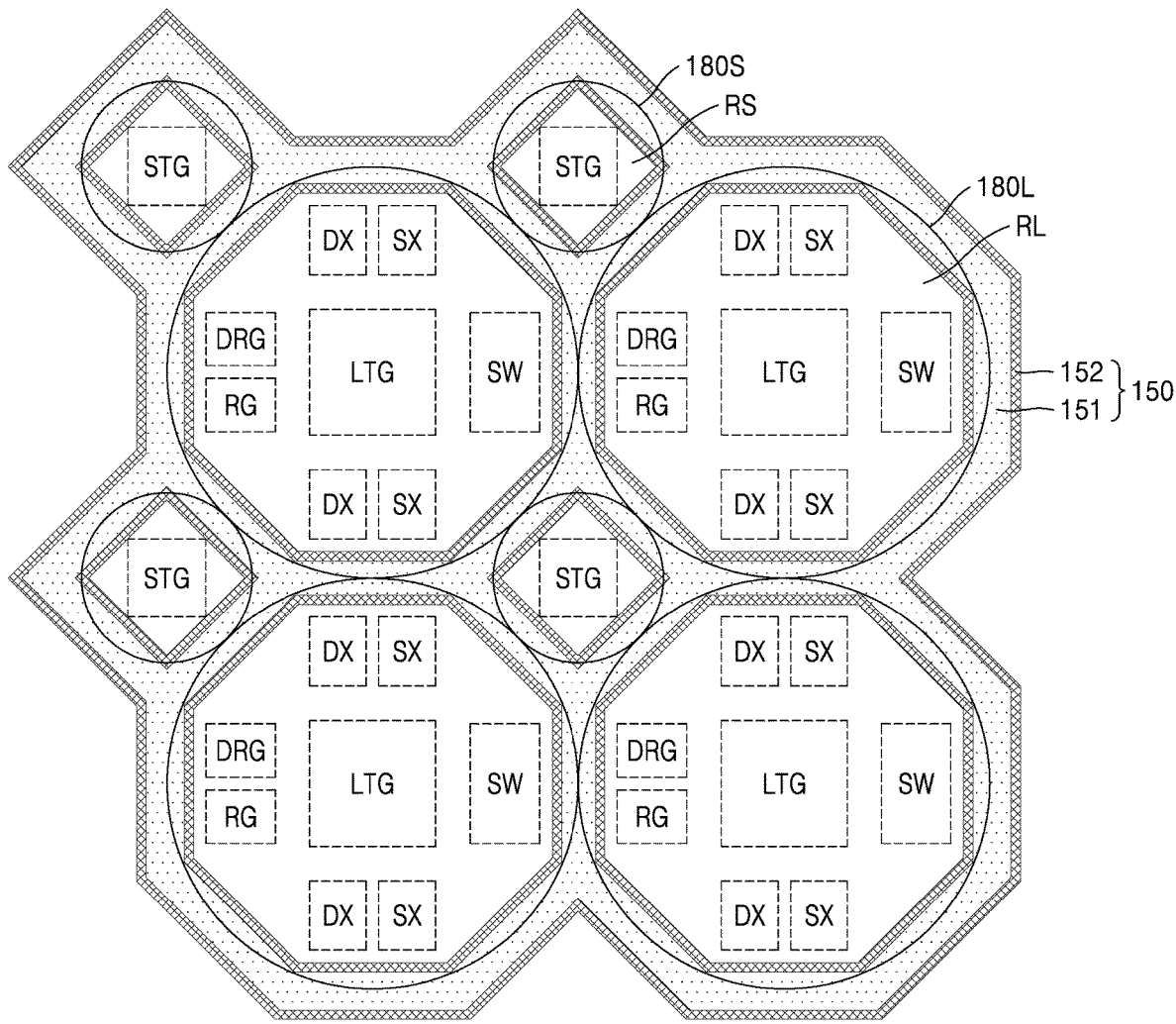
FIG. 8 is a plan view of an image sensor according to embodiments of the inventive concept.
Figure 8:
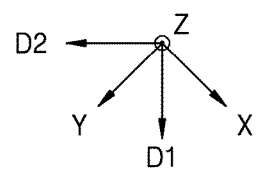

FIG. 7 is a plan view of an image sensor 100a according to embodiments of the inventive concept. FIG. 8 is a plan view of an image sensor 100b according to embodiments of the inventive concept. Hereinafter, differences among the image sensor 100 shown in FIG. 4, the image sensor 100a shown in FIG. 7, and the image sensor 100b shown in FIG. 8 will be described.

Referring to FIGS. 4, 7, and 8, when viewed from above, the arrangement of the reset transistor RG, the selecting transistor SX, the driving transistor DX, the switch transistor SW, and the gain control transistor DRG may vary. The arrangements of the reset transistor RG, the selecting transistor SX, the driving transistor DX, the switch transistor SW, and the gain control transistor DRG shown in FIGS. 4, 7, and 8 are merely examples and not limited thereto.

For example, in FIG. 4, the reset transistor RG may be located at a region adjacent to the first transfer gate LTG in a third horizontal direction (D1 direction), the selecting transistor SX may be located at a region adjacent to the first transfer gate LTG in a direction opposite to a fourth horizontal direction (D2 direction), the driving transistor DX may be located at a region adjacent to the first transfer gate LTG in a direction opposite to the third horizontal direction (D1 direction), and the switch transistor SW and the gain control transistor DRG may be located at a region adjacent to the first transfer gate LTG in the fourth horizontal direction (D2 direction).

For example, in FIG. 7, the reset transistor RG may be located at a region adjacent to the first transfer gate LTG in the direction opposite to the fourth horizontal direction (D2 direction), the selecting transistor SX and the driving transistor DX may be located at opposite regions adjacent to the first transfer gate LTG in the third horizontal direction (D1 direction) and the direction opposite to the third horizontal direction (D1 direction), respectively, and the switch transistor SW and the gain control transistor DRG may be located at a region adjacent to the first transfer gate LTG in the fourth horizontal direction (D2 direction).

For example, in FIG. 8, the reset transistor RG and the gain control transistor DRG may be located at a region adjacent to the first transfer gate LTG in the fourth horizontal direction (D2 direction), the switch transistor SW may be located at region adjacent to the first transfer gate LTG in the direction opposite to the fourth horizontal direction (D2 direction), and the driving transistor DX and the selecting transistor SX may be located at opposite regions adjacent to the first transfer gate LTG in the third horizontal direction (D1 direction) and the direction opposite to the third horizontal direction (D1 direction), respectively.

Figure 9:
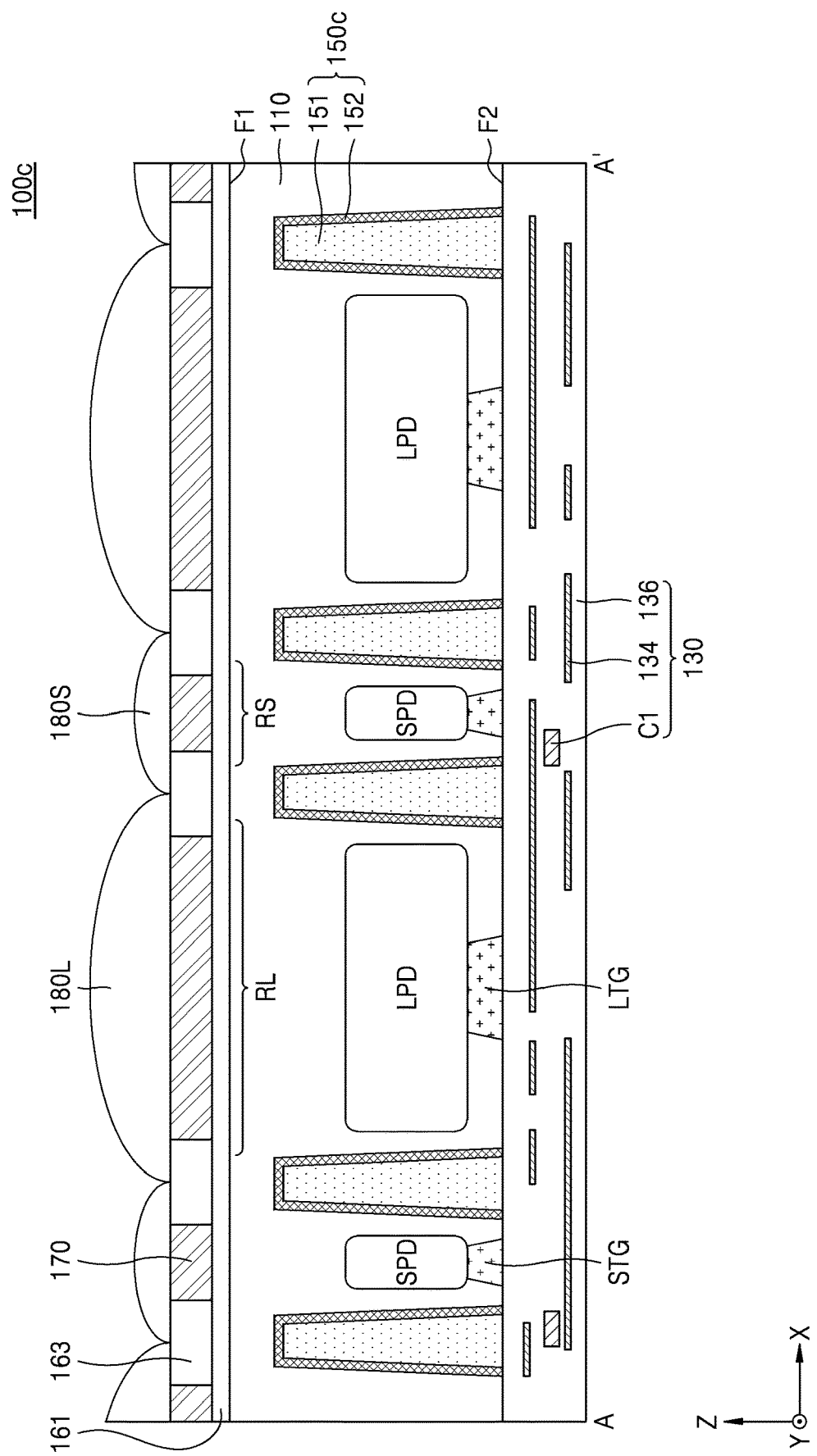
FIG. 9 is a cross-sectional view of an image sensor according to embodiments of the inventive concept, taken along a line A-A' of FIG. 4.
Figure 10:
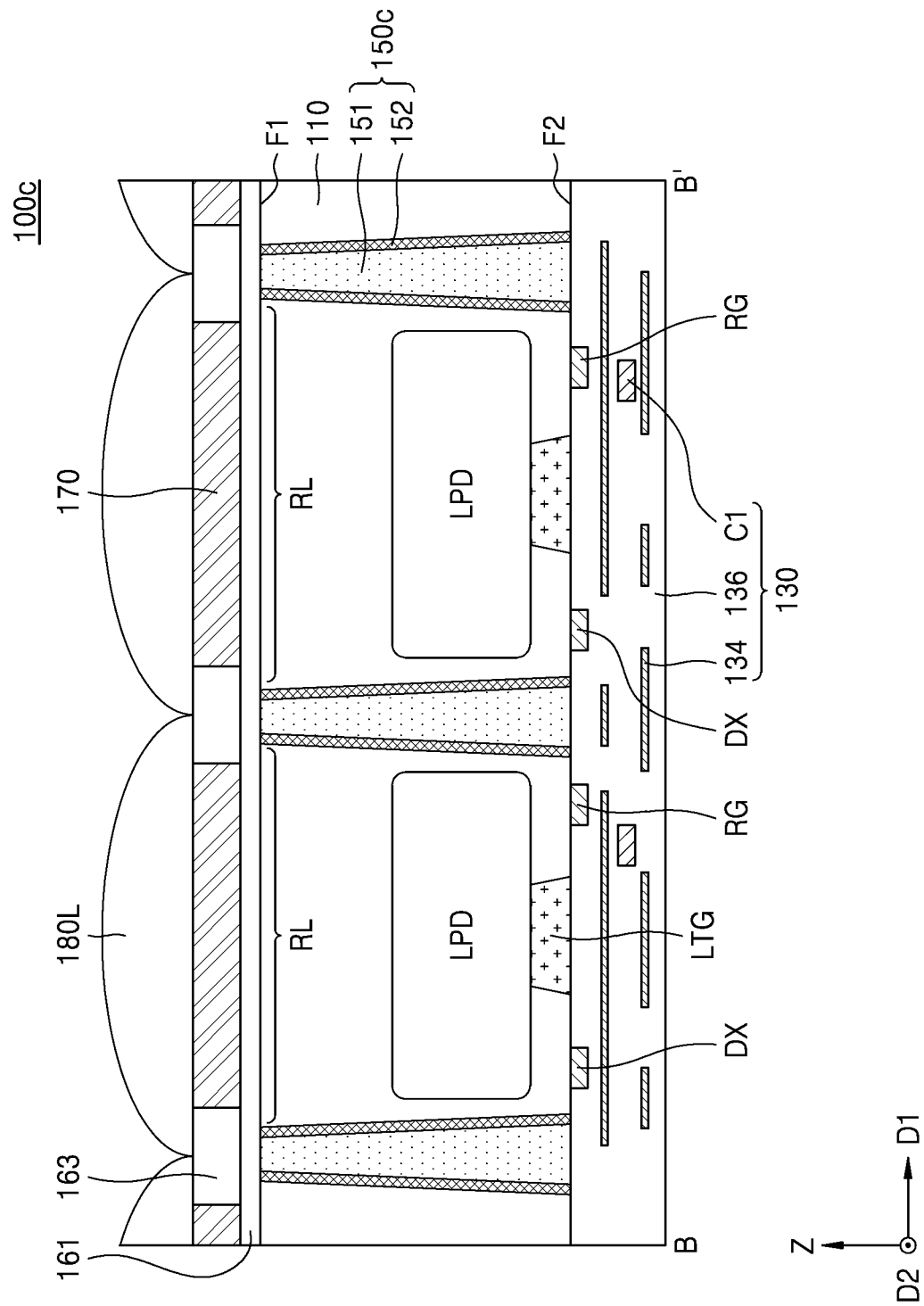
FIG. 10 is a cross-sectional view of an image sensor according to embodiments of the inventive concept, taken along a line B-B' of FIG. 4.

FIG. 9 is a cross-sectional view of an image sensor 100c according to embodiments of the inventive concept, taken along line A-A' of FIG. 4. FIG. 10 is a cross-sectional view of the image sensor 100c according to embodiments of the inventive concept, taken along line B-B' of FIG. 4. Hereinafter, differences between the image sensor 100 shown in FIGS. 4 to 6 and the image sensor 100c shown in FIGS. 9 and 10 will be described.

Referring to FIGS. 9 and 10, the image sensor 100c may include an isolation structure 150c instead of the isolation structure 150 shown in FIGS. 4 to 6. The isolation structure 150c may include a portion extending between the first photodiode LPD and the second photodiode SPD and a portion extending between two first photodiodes LPD adjacent to each other.

As shown in FIG. 9, the portion of the isolation structure 150c extending between the first photodiode LPD and the second photodiode SPD may extend in the vertical direction (Z direction) from the second surface F2 of the substrate 110 toward the first surface F1 of the substrate 110. However, the portion of the isolation structure 150c extending between the first photodiode LPD and the second photodiode SPD may only partially penetrate the substrate 110 in the vertical direction (Z direction) instead of completely penetrating through the substrate 110. On the contrary, as shown in FIG. 10, the portion of the isolation structure 150c between the two first photodiodes LPD adjacent to each other may completely penetrate the substrate 110 in the vertical direction (Z direction) from the second surface F2 of the substrate 110 toward the first surface F1 of the substrate 110.

Figure 11A:
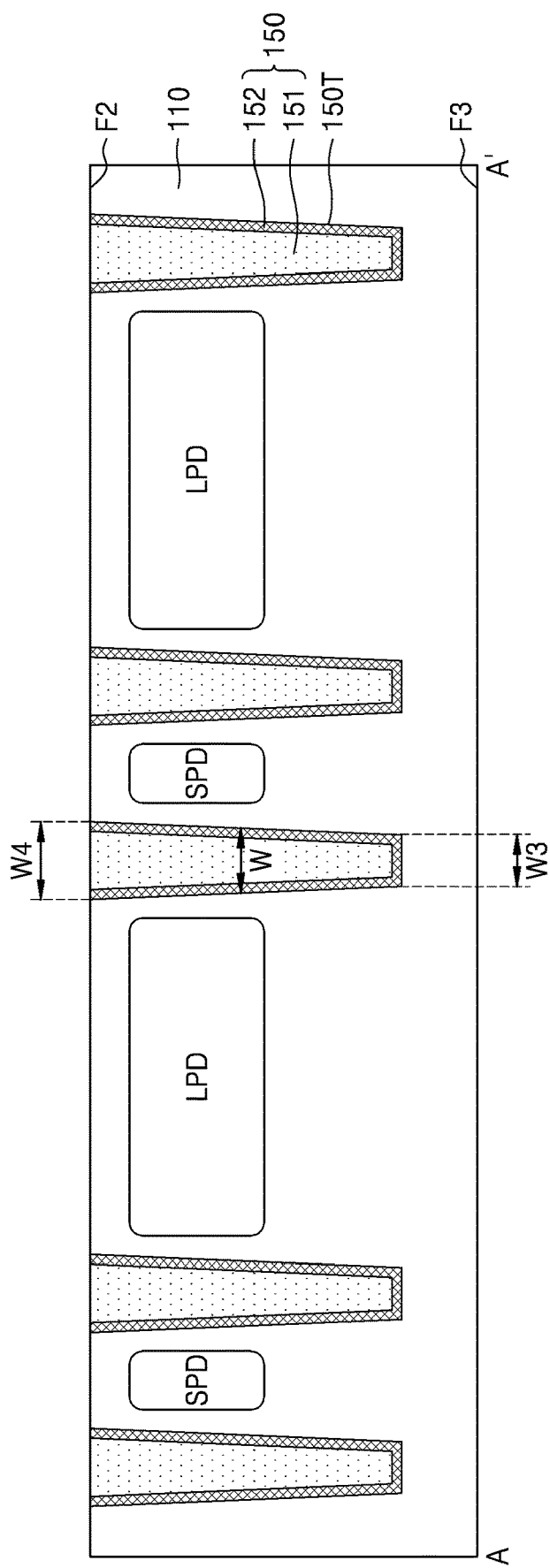
FIGS. 11A to 11C are cross-sectional views showing a method of manufacturing an image sensor according to embodiments of the inventive concept.
Figure 11B:
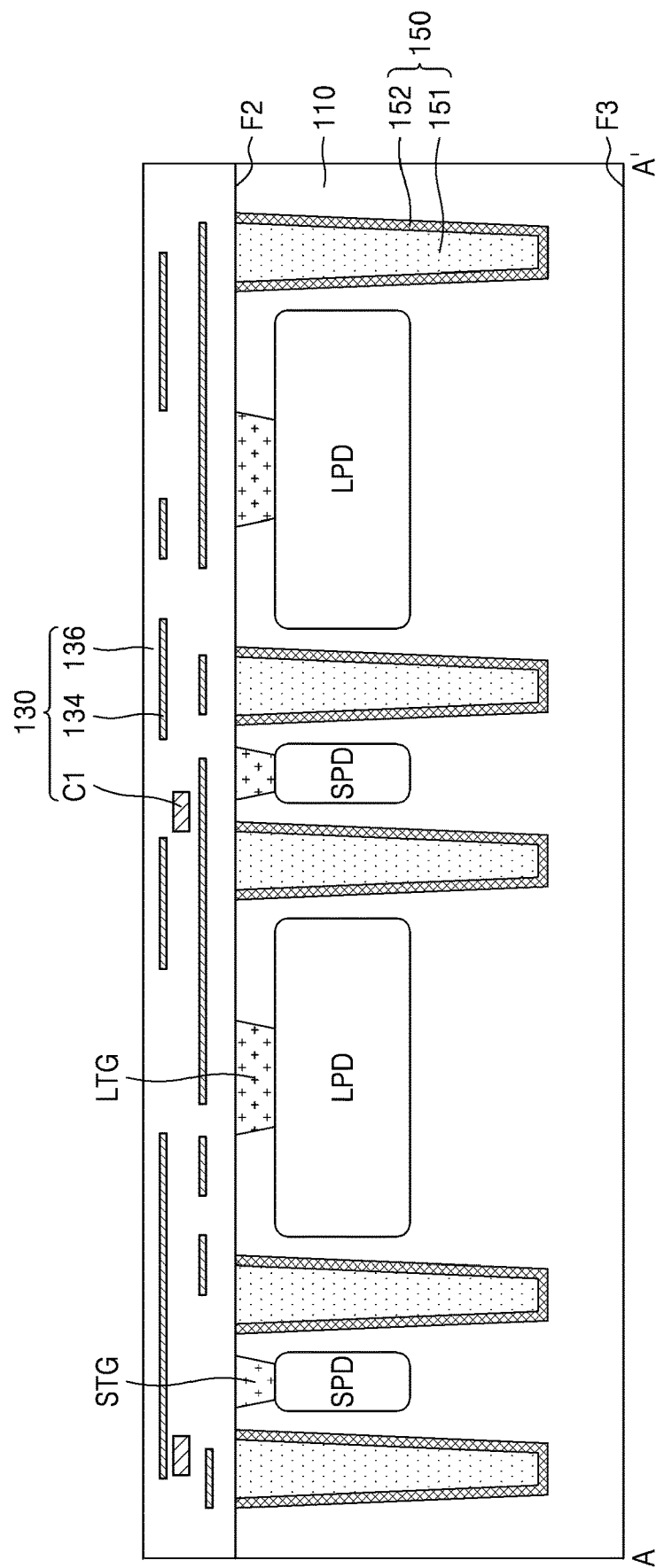
Figure 11C:
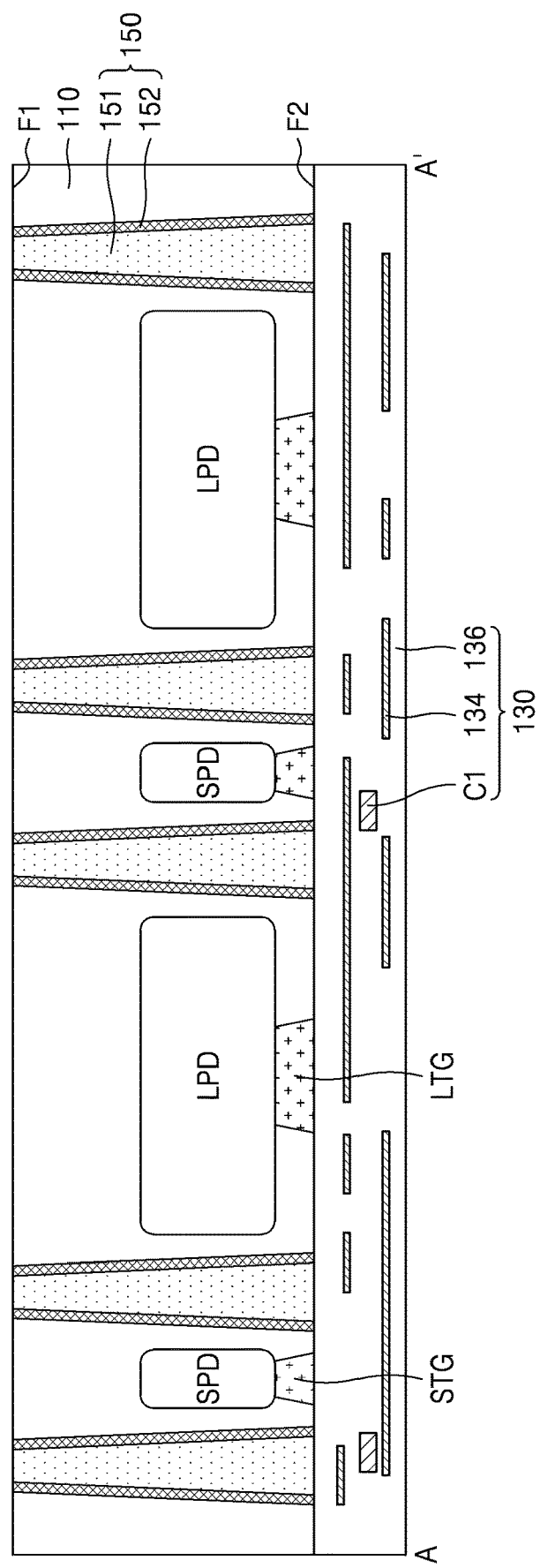

FIGS. 11A to 11C are cross-sectional views showing a method of manufacturing an image sensor according to embodiments of the inventive concept. FIGS. 11A to 11C are cross-sectional views corresponding to the line A-A' of FIG. 4.

Referring to FIG. 11A, the substrate 110 having the second surface F2 and a third surface F3 is prepared. A mask pattern (not shown) may be formed on the second surface F2 of the substrate 110, and a trench 150T may be formed in the substrate 110 by removing a portion of the substrate 110 from the second surface F2 of the substrate 110 by using the mask pattern as an etching mask. Thereafter, the mask pattern may be removed. Because a portion of the substrate 110 is etched from the second surface F2 of the substrate 110 to form the trench 150T, a width W3 of the bottom of the trench 150T may be less than a width of the top of the trench 150T. A width W of the trench 150T may decrease in a direction from the second surface F2 of the substrate 110 toward the third surface F3 of the substrate 110. In some embodiments, the width W of the trench 150T may gradually decrease in the direction from the second surface F2 of the substrate 110 toward the third surface F3 of the substrate 110.

Thereafter, the isolating insulation layer 152 is formed on the second surface F2 and the trench 150T. The conductive layer 151 is formed on the isolating insulation layer 152 to fill the remaining portion of the trench 150T. Portions of the isolating insulation layer 152 and the conductive layer 151 may be removed through a planarization process, for example, to expose the second surface F2 of the substrate 110. Therefore, the isolation structure 150 may be formed. The top of the isolation structure 150 may be coplanar with the second surface F2 of the substrate 110. The isolation structure 150 may be formed to extend from the second surface F2 of the substrate 110 toward the third surface F3 of the substrate 110. However, the isolation structure 150 may not reach the third surface F3. For example, the isolation structure 150 may only partially penetrate the substrate 110 instead of completely penetrating through the substrate 110.

Next, the first photodiode LPD and the second photodiode SPD may be formed through an ion implantation process performed on the second surface F2 of the substrate 110.

Referring to FIG. 11B, the first transfer gate LTG extending into the substrate 110 from the second surface F2 of the substrate 110 and electrically connected to the first photodiode LPD and the second transfer gate STG extending into the substrate 110 from the second surface F2 of the substrate 110 and electrically connected to the second photodiode SPD may be formed.

The selecting transistor SX, the driving transistor DX, the reset transistor RG, the switch transistor SW, and the gain control transistor DRG may be formed on the second surface F2 of the substrate 110. Next, the front surface structure 130 may be formed on the second surface F2 of the substrate 110. For example, the insulation layer 136, the wire 134, and the capacitor C1 may be formed to constitute the front surface structure 130.

Referring to FIG. 11C, the result structure of FIG. 11B may be turned upside down. Next, a portion of the substrate 110 may be removed from the third surface F3 (refer to FIG. 11B) of the substrate 110 through a planarization process, for example, to expose the conductive layer 151. Therefore, the first surface F1 of the substrate 110 may be formed. The isolation structure 150 may completely penetrate the substrate 110 by extending from the second surface F2 of the substrate 110 to the first surface F1 of the substrate 110. A first end of the isolation structure 150 may be coplanar with the second surface F2 of the substrate 110, whereas a second end of the isolation structure 150 may be coplanar with the first surface F1 of the substrate 110.

Referring to FIG. 5, the anti-reflection layer 161 may be formed on the first surface F1 of the substrate 110. Next, the fence 163 may be formed on the anti-reflection layer 161. Next, the color filter 170 may be formed on the anti-reflection layer 161. Next, the first micro-lens 180L may be formed on the color filter 170 and the fence 163, such that the first micro-lens 180L overlaps the first photodiode LPD when viewed from above. Also, the second micro-lens 180S may be formed on the color filter 170 and the fence 163, such that the second micro-lens 180S overlaps the second photodiode SPD when viewed from above. Therefore, the image sensor 100 may be manufactured.

Figure 12A:
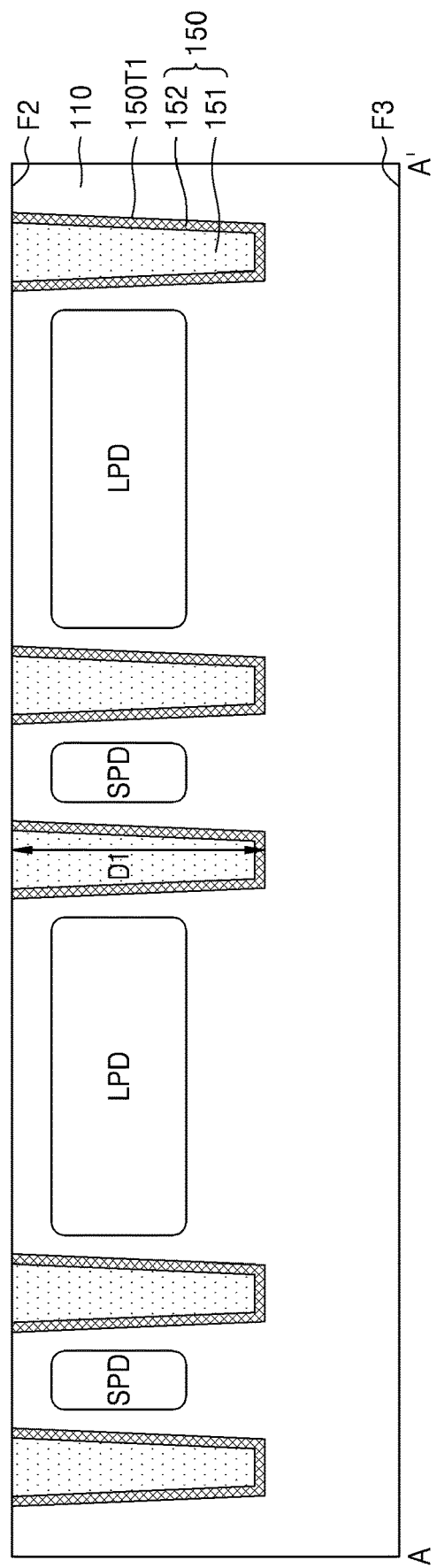
FIGS. 12A to 12F are cross-sectional views showing a method of manufacturing an image sensor according to embodiments of the inventive concept.
Figure 12B:
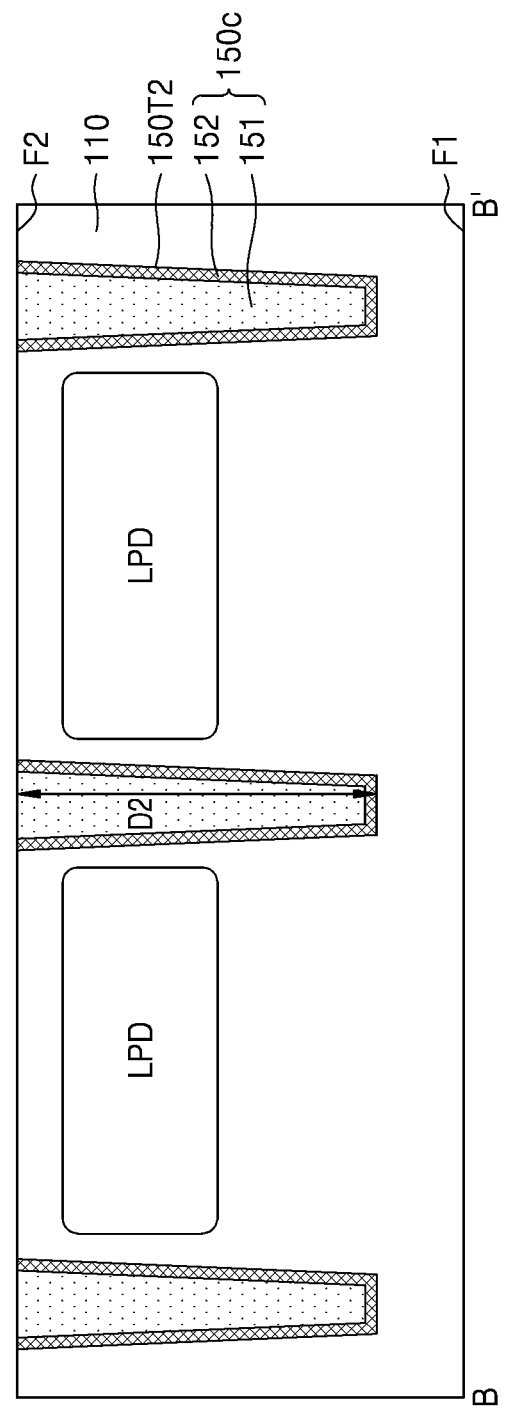
Figure 12C:
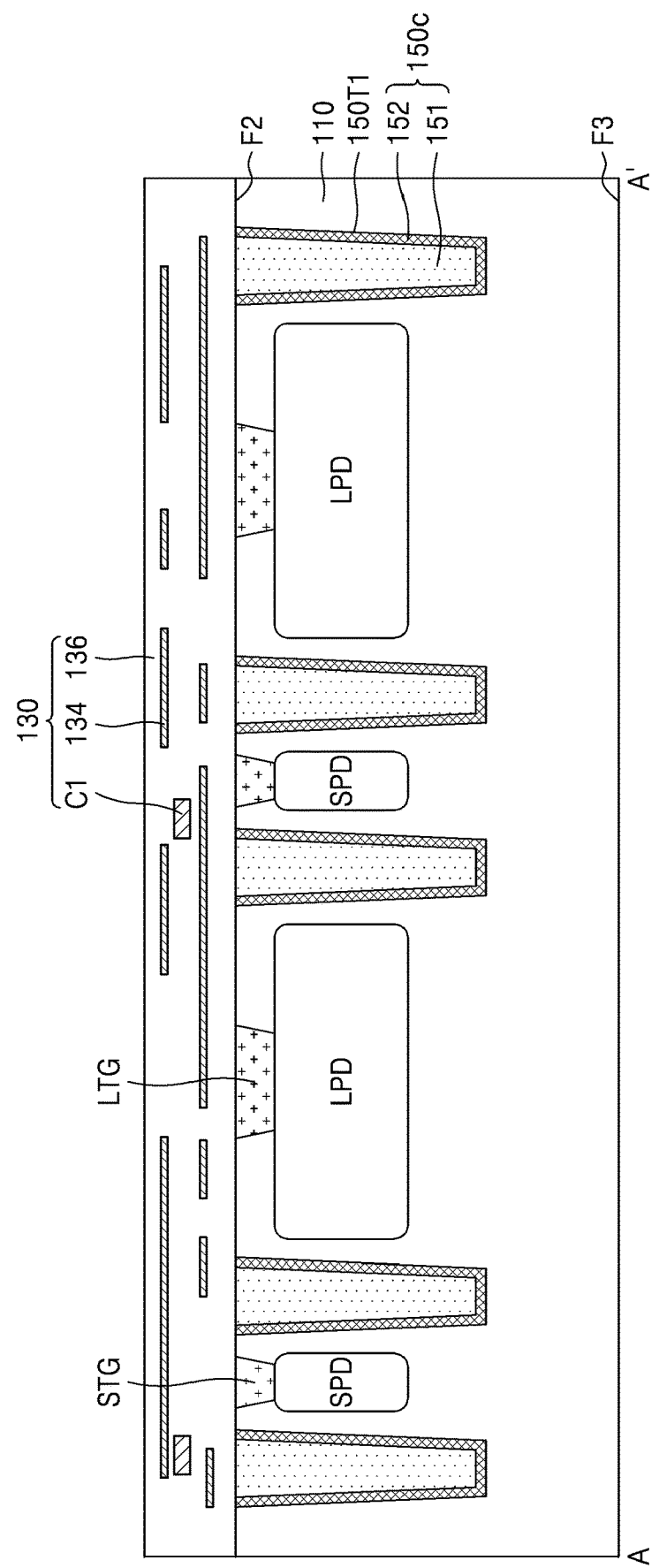
Figure 12D:
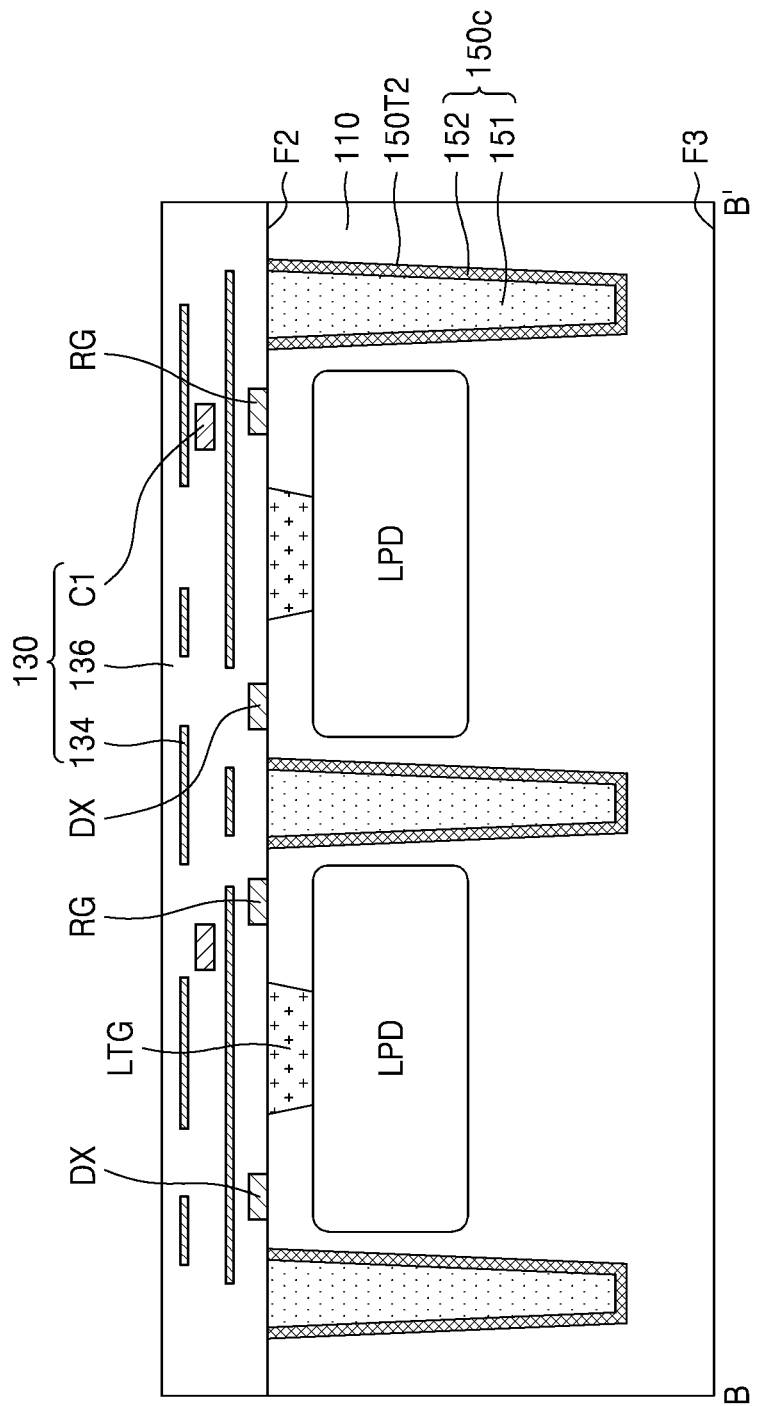
Figure 12E:
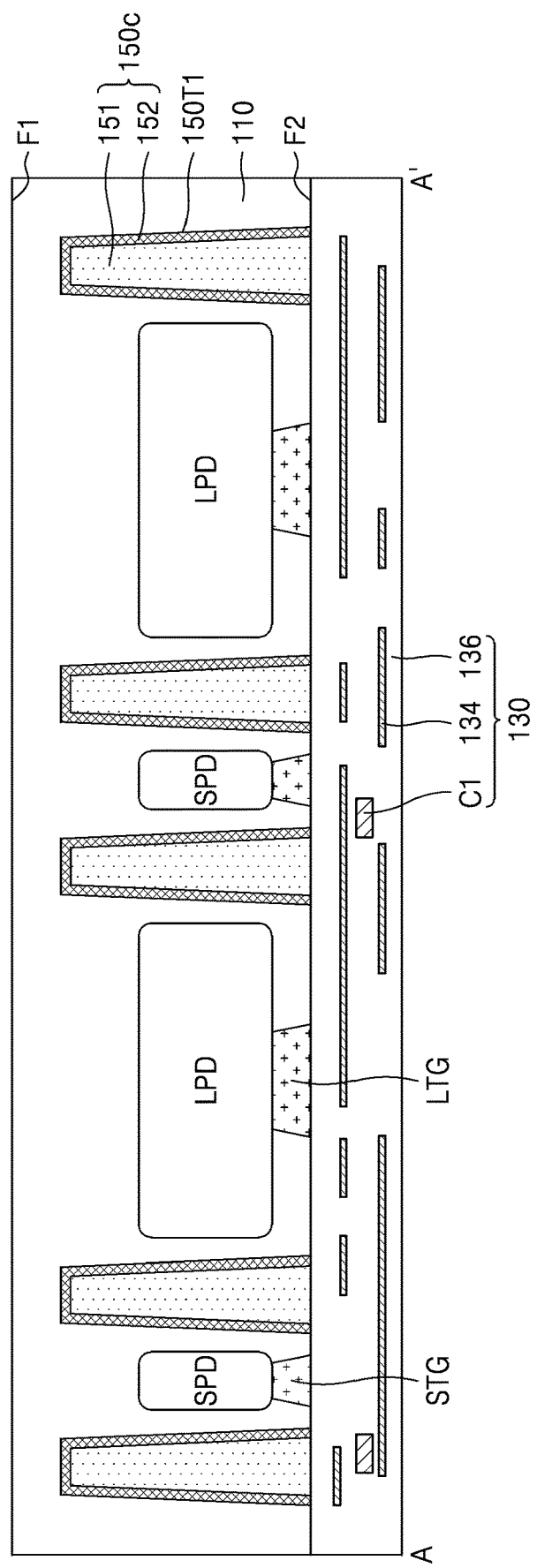

FIGS. 12A to 12F are cross-sectional views showing a method of manufacturing an image sensor according to embodiments of the inventive concept. FIGS. 12A, 12C, and 12E are cross-sectional views taken along the line A-A' of FIG. 4, and FIGS. 12B, 12D, and 12F are cross-sectional views taken along the line B-B' of FIG. 4.

Referring to FIGS. 12A and 12B, the substrate 110 having the second surface F2 and a third surface F3 is prepared. A first trench 150T1 may be formed by removing a portion of the substrate 110 from the second surface F2 of the substrate 110. Also, a second trench 150T2 may be formed by removing a portion of the substrate 110 from the second surface F2 of the substrate 110. A depth D1 of the first trench 150T1 may be less than a depth D2 of the second trench 150T2.

Next, the isolating insulation layer 152 is formed on the second surface F2 of the substrate 110, the first trench 150T1, and the second surface F2. Next, the conductive layer 151 is formed on the isolating insulation layer 152 to fill remaining portions of the first trench 150T1 and the second trench 150T2. Next, portions of the isolating insulation layer 152 and the conductive layer 151 may be removed through a planarization process, for example, to expose the second surface F2 of the substrate 110. Therefore, the isolation structure 150c may be formed. The isolation structure 150c may be formed to extend from the second surface F2 of the substrate 110 toward the third surface F3 of the substrate 110. However, the isolation structure 150c may not reach the third surface F3. For example, the isolation structure 150c may only partially penetrate the substrate 110 instead of completely penetrating through the substrate 110.

The first photodiode LPD and the second photodiode SPD may be formed through an ion implantation process performed on the second surface F2 of the substrate 110. The first trench 150T1 may extend between the first photodiode LPD and the second photodiode SPD, whereas the second trench 150T2 may extend between two first photodiodes LPD adjacent to each other.

Referring to FIGS. 12C and 12D, the first transfer gate LTG extending into the substrate 110 from the second surface F2 of the substrate 110 and electrically connected to the first photodiode LPD may be formed, and the second transfer gate STG extending into the substrate 110 from the second surface F2 of the substrate 110 and electrically connected to the second photodiode SPD may be formed.

Also, the selecting transistor SX, the driving transistor DX, the reset transistor RG, the switch transistor SW, and the gain control transistor DRG may be formed on the second surface F2 of the substrate 110. Next, the front surface structure 130 may be formed on the second surface F2 of the substrate 110. For example, the insulation layer 136, the wire 134, and the capacitor C1 may be formed to constitute the front surface structure 130.

Figure 12F:
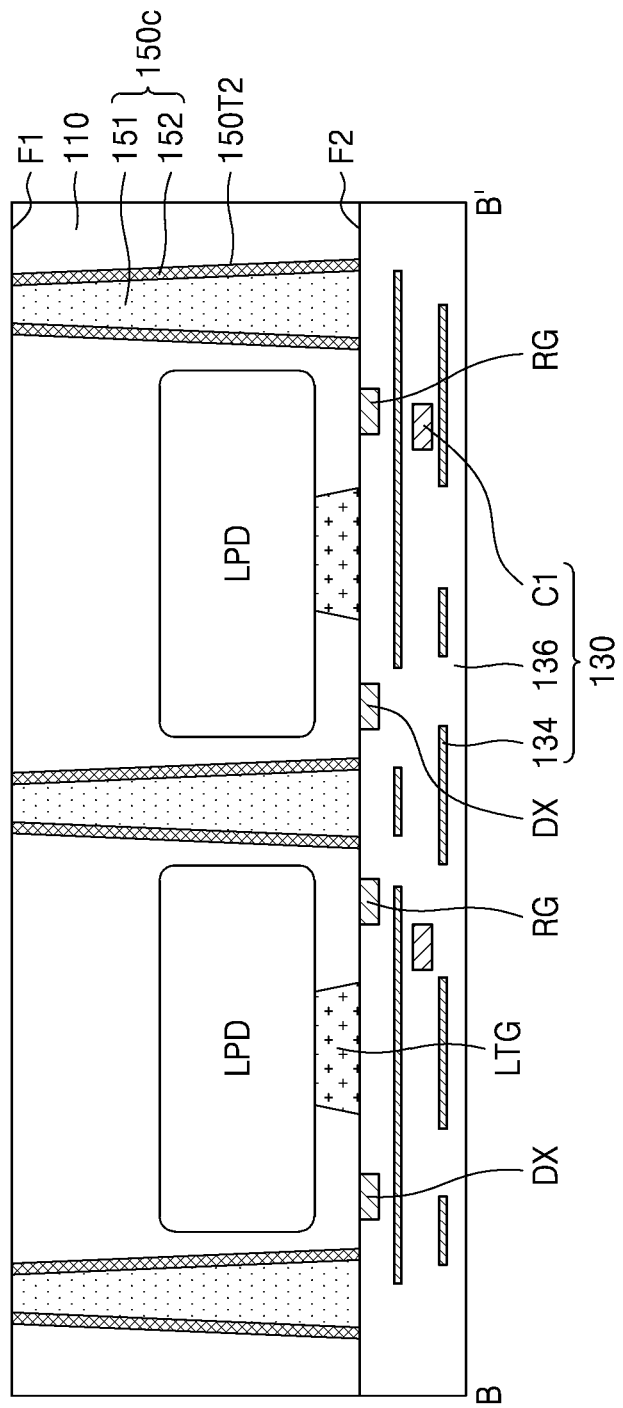

Referring to FIGS. 12E and 12F, the result structure of FIGS. 12C and 12D may be turned upside down. Next, a portion of the substrate 110 may be removed from the third surface F3 (refer to FIGS. 12C and 12D) through a planarization process, for example, to expose a portion of the conductive layer 151 in the second trench 150T2. Therefore, the first surface F1 of the substrate 110 may be formed. As shown in FIG. 12E, a portion of the isolation structure 150c in the first trench 150T1 may not reach the first surface F1 of the substrate 110. For example, the portion of the isolation structure 150c in the first trench 150T1 may only partially penetrate the substrate 110 instead of completely penetrating through the substrate 110. On the contrary, a portion of the isolation structure 150c in the second trench 150T2 may completely penetrate the substrate 110 by extending from the second surface F2 of the substrate 110 to the first surface F1 of the substrate 110. A first end of the portion of the isolation structure 150c in the second trench 150T2 may be coplanar with the second surface F2 of the substrate 110, whereas a second end of the portion of the isolation structure 150c in the second trench 150T2 may be coplanar with the first surface F1 of the substrate 110.

Referring to FIGS. 9 and 10, the anti-reflection layer 161 may be formed on the first surface F1 of the substrate 110. Next, the fence 163 may be formed on the anti-reflection layer 161. Next, the color filter 170 may be formed on the anti-reflection layer 161. Next, the first micro-lens 180L may be formed on the color filter 170 and the fence 163, such that the first micro-lens 180L overlaps the first photodiode LPD when viewed from above. Also, the second micro-lens 180S may be formed on the color filter 170 and the fence 163, such that the second micro-lens 180S overlaps the second photodiode SPD when viewed from above. Therefore, the image sensor 100c may be manufactured.

While the inventive concept has been particularly shown and described with reference to embodiments thereof, it will be understood that various changes in form and details may be made therein without departing from the spirit and scope of the following claims.

What is claimed is:

1. An image sensor comprising:
a substrate comprising a first surface and a second surface facing the first surface of the substrate;
a first photodiode located in a first region of the substrate and configured to generate photocharges from light incident on the first region of the first surface;
a second photodiode located in a second region of the substrate and configured to generate photocharges from light incident on the second region of the first surface; and
an isolation structure defining the first region in which the first photodiode is located and the second region in which the second photodiode, and extending between the first photodiode and the second photodiode,
wherein an area of the second region is smaller than an area of the first region,
wherein a first end of the isolation structure is coplanar with the second surface of the substrate, and
wherein the isolation structure extends in a vertical direction from the second surface of the substrate toward the first surface of the substrate.

2. The image sensor of claim 1,
wherein at least a portion of the isolation structure completely penetrates the substrate in the vertical direction from the first surface of the substrate to the second surface of the substrate.

3. The image sensor of claim 1,
wherein, when viewed in a plan view, the isolation structure surrounds each of the first photodiode and the second photodiode.

4. The image sensor of claim 1,
wherein, when viewed in a plan view, the first region has an octagonal shape, and the second region has a quadrangle shape.

5. The image sensor of claim 1, further comprising:
a third photodiode located in a third region of the substrate and configured to generate photocharges from light incident on the third region of the first surface,
wherein an area of the third region is identical to the area of the first region, and
wherein the isolation structure further defines the third region of the substrate and extends between the third photodiode and the first photodiode and between the third photodiode and the second photodiode.

6. The image sensor of claim 5,
wherein a first portion of the isolation structure between the third photodiode and the first photodiode completely penetrates the substrate in the vertical direction from the second surface of the substrate to the first surface of the substrate, and
wherein a second portion of the isolation structure between the third photodiode and the second photodiode and a third portion of the isolation structure between the first photodiode and the second photodiode partially penetrate through the substrate in the vertical direction from the second surface of the substrate toward the first surface of the substrate.

7. The image sensor of claim 5,
wherein a first portion of the isolation structure between the third photodiode and the first photodiode, a second portion of the isolation structure between the third photodiode and the second photodiode, and a third portion of the isolation structure between the first photodiode and the second photodiode completely penetrate the substrate in the vertical direction from the second surface of the substrate to the first surface of the substrate.

8. The image sensor of claim 1, further comprising:
a first transfer gate extending into the substrate from the second surface of the substrate and electrically connected to the first photodiode; and
a second transfer gate extending into the substrate from the second surface of the substrate and electrically connected to the second photodiode.

9. The image sensor of claim 8,
wherein, when viewed in a plan view, the first transfer gate overlaps a center of the first region, and the second transfer gate overlaps a center of the second region.

10. The image sensor of claim 1,
wherein sensitivity of the first photodiode is higher than sensitivity of the second photodiode.

11. An image sensor comprising:
a substrate comprising a first surface on which light is incident and a second surface facing the first surface;
a high-sensitive photodiode disposed in the substrate having a first sensitivity;
a low-sensitive photodiode disposed in the substrate and having a second sensitivity lower than the first sensitivity of the high-sensitive photodiode; and
an isolation structure configured to electrically isolate the high-sensitive photodiode and the low-sensitive photodiode from each other,
wherein the isolation structure completely penetrates the substrate in a vertical direction from the second surface of the substrate to the first surface of the substrate.

12. The image sensor of claim 11, further comprising:
a gain control transistor configured to switch a conversion gain for converting photocharges generated by the high-sensitive photodiode into a voltage to one of a high conversion gain and a low conversion gain.

13. The image sensor of claim 11, further comprising:
a capacitor configured to store at least some of photocharges generated by the low-sensitive photodiode.

14. The image sensor of claim 11, further comprising:
a switch transistor configured to switch a conversion gain for converting photocharges generated by the low-sensitive photodiode into a voltage to one of a high conversion gain and a low conversion gain.

15. The image sensor of claim 11,
wherein a first end of the isolation structure is coplanar with the second surface.

16. The image sensor of claim 15,
wherein a second end of the isolation structure is coplanar with the first surface.

17. The image sensor of claim 16,
wherein a width of the first end of the isolation structure in a horizontal direction perpendicular to the vertical direction is greater than a width of the second end of the isolation structure in the horizontal direction.

18. The image sensor of claim 11,
wherein the isolation structure comprises:
a conductive layer completely penetrating the substrate in the vertical direction from the second surface of the substrate to the first surface of the substrate; and
an isolating insulation layer between the conductive layer and the substrate.

19. An image sensor comprising:
a substrate comprising a first surface and a second surface facing each other;
a first micro-lens on a first region of the first surface;

a second micro-lens on a second region of the first surface;

a first photodiode located in a portion of the substrate below the first micro-lens;

a second photodiode located in a portion of the substrate below the second micro-lens;

an isolation structure extending in a vertical direction from the second surface toward the first surface and surrounding each of the first photodiode and the second photodiode;

a first transfer gate extending into the substrate from the second surface of the substrate and electrically connected to the first photodiode; and a second transfer gate extending into the substrate from the second surface of the substrate and electrically connected to the second photodiode, wherein an area of the second micro-lens is smaller than an area of the first micro-lens.

20. The image sensor of claim 19, wherein a width of the isolation structure in a horizontal direction perpendicular to the vertical direction decreases in the vertical direction from the second surface toward the first surface.

* * * * *